United States Patent
Palmer et al.

(10) Patent No.: US 9,419,598 B2
(45) Date of Patent: Aug. 16, 2016

(54) IN-SITU DELAY ELEMENT CALIBRATION

(71) Applicant: Rambus Inc., Sunnyvale, CA (US)

(72) Inventors: Robert E. Palmer, Chapel Hill, NC (US); Michael D. Bucher, Carrboro, NC (US); Andrew M. Fuller, Durham, NC (US)

(73) Assignee: Rambus Inc., Sunnyvale, CA (US)

( * ) Notice: Subject to any disclaimer, the term of this patent is extended or adjusted under 35 U.S.C. 154(b) by 0 days.

(21) Appl. No.: 14/539,564

(22) Filed: Nov. 12, 2014

(65) Prior Publication Data

US 2015/0145581 A1 May 28, 2015

Related U.S. Application Data

(60) Provisional application No. 61/909,268, filed on Nov. 26, 2013.

(51) Int. Cl.
*H03K 5/13* (2014.01)
*H03K 5/135* (2006.01)
*H03K 5/00* (2006.01)

(52) U.S. Cl.
CPC ........... *H03K 5/131* (2013.01); *H03K 5/135* (2013.01); *H03K 2005/00058* (2013.01)

(58) Field of Classification Search
USPC .......... 327/261, 263, 276–278, 280, 291, 298
See application file for complete search history.

(56) References Cited

U.S. PATENT DOCUMENTS

| | | | |
|---|---|---|---|
| 6,421,784 B1* | 7/2002 | Chu | G06F 5/06 327/276 |
| 7,012,956 B1 | 3/2006 | Thomsen et al. | |
| 7,529,962 B1 | 5/2009 | Berhanu et al. | |
| 7,716,001 B2 | 5/2010 | Lee et al. | |
| 8,064,562 B2* | 11/2011 | Schnarr | G11C 7/1051 375/376 |
| 8,219,343 B2 | 7/2012 | Lin | |
| 9,143,121 B2* | 9/2015 | Gonzalez | H03K 5/1565 |
| 2012/0249200 A1 | 10/2012 | Yu | |

OTHER PUBLICATIONS

Pelgrom et al.,"Matching Properties of MOS Transistors," IEEE Journal of Solid-State Circuits, vol. 24, No. 5, pp. 1433-1439, Oct. 1989. 8 pages.

* cited by examiner

*Primary Examiner* — An Luu
(74) *Attorney, Agent, or Firm* — The Neudeck Law Firm, LLC

(57) ABSTRACT

A controllable delay element includes a delay element to provide a variable delay from an input signal to an output signal. The variable delay can be controlled by a digital delay input. The delay element has a delay range that is controlled in response to a delay range input. The delay range of the delay element can be calibrated to a desired range of delays in response to a relative delay between a first timing reference and a second timing reference. A common timing reference is applied to a plurality of receivers and a strobe receiver. The delay through the strobe receiver is adjusted to measure the delay mismatches between the plurality of receivers. The mismatches are used to select a value for the delay through the strobe receiver.

20 Claims, 18 Drawing Sheets

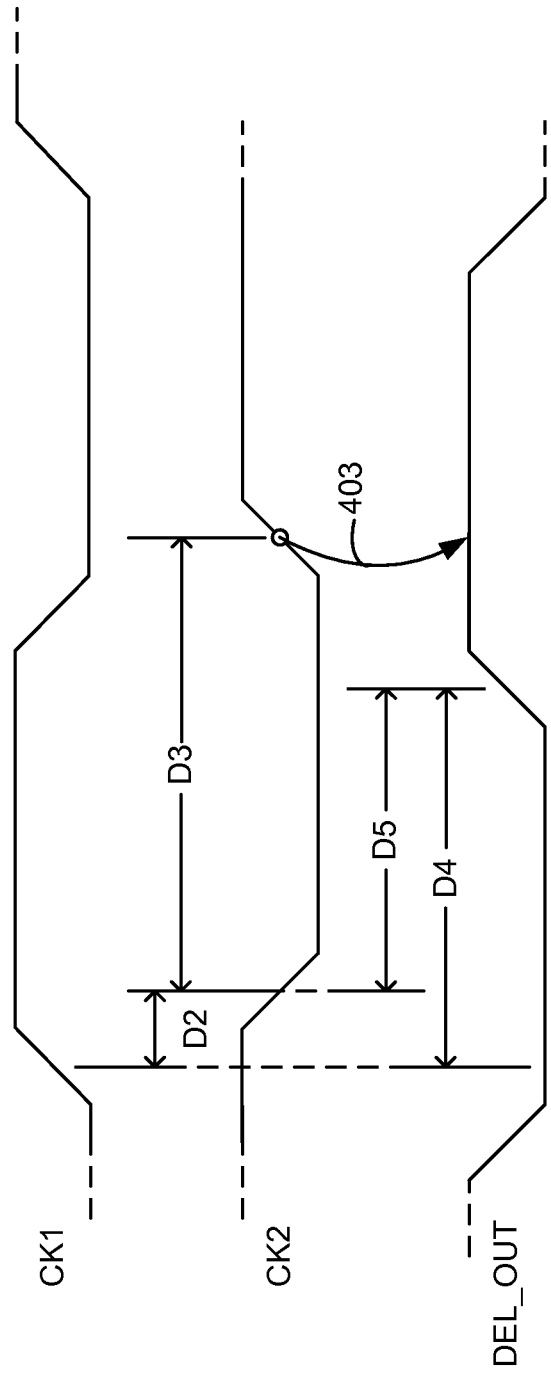

IN-SITU DELAY ELEMENT CALIBRATION

CROSS-REFERENCE TO RELATED APPLICATIONS

The present application claims the benefit of U.S. Provisional Application Ser. No. 61/909,268, filed Nov. 26, 2013, and titled IN-SITU DELAY ELEMENT CALIBRATION, which is hereby incorporated herein by reference for all purposes.

BRIEF DESCRIPTION OF THE DRAWINGS

FIGS. 4A-4E are timing diagrams illustrating a process of calibrating the range of a delay element.

DETAILED DESCRIPTION OF THE EMBODIMENTS

Digital communication systems may use digitally controlled delay elements to adjust the timing of signals. The delay of these digitally controlled delay elements, and the adjustable delay range vary with various circuit parameter variations—such as process, voltage, and temperature (PVT) variations. In an embodiment, the relative delay between two timing references is used to calibrate the adjustable delay range (i.e., the difference between the maximum programmable delay and minimum programmable delay).

Source synchronous communication systems rely on accurate timing relationships between a clock/strobe and data. Both the clock/strobe and data signals may be passed through respective digitally controlled delay elements in order to achieve the appropriate timing relationship. In an embodiment, the clock/strobe and data signal delay elements are provided with the same timing reference as an input. The output of the clock/strobe delay element is distributed to the data signal receivers as a sample strobe. This allows the delay of each data signal path to be measured relative to the clock/strobe signal path to that receiver. These measurements are used to select a calibrated clock/strobe delay element setting (e.g., midpoint of the mismatches).

Figure 1:
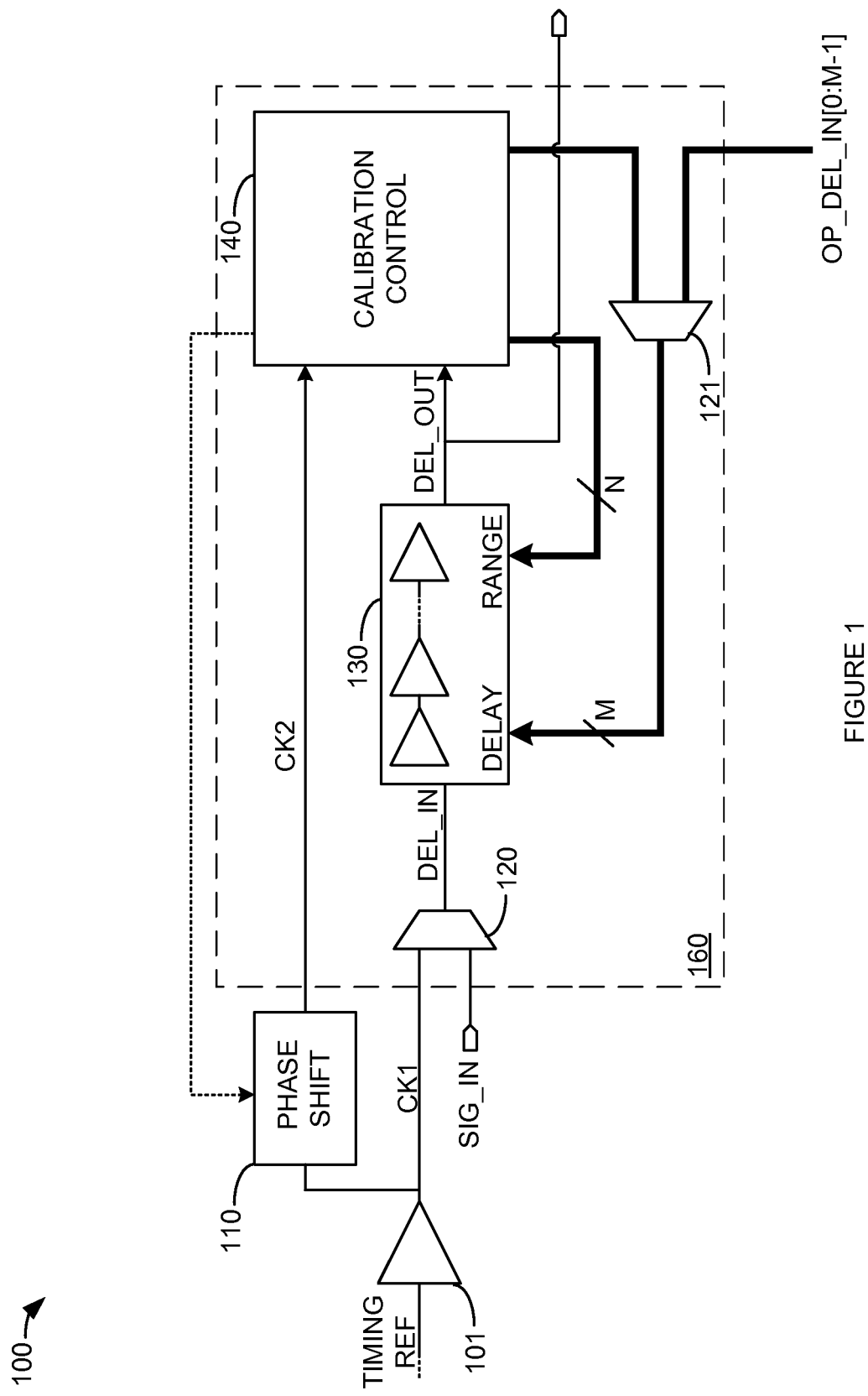
FIG. 1 is a block diagram illustrating a variable delay system.

FIG. 1 is a block diagram illustrating a variable delay system in accordance with an embodiment. In FIG. 1, variable delay system 100 includes buffer 101, phase shift 110, and delay circuit 160. Delay circuit 160 includes 2:1 multiplexor (MUX) 120, 2M:M MUX 121, variable delay element 130, and calibration control 140. A timing reference signal is operatively coupled to the input of buffer 101. The output of buffer 101 (signal/node CK1) is operatively coupled to an input of phase shift 110 and a first input of MUX 120. A second input of MUX 120 is operatively coupled to an input signal port SIG_IN. The output of MUX 120 (signal/node DEL_IN) is operatively coupled to the input of variable delay element 130. The M bit output of MUX 121 is operatively coupled to the DELAY input of variable delay element 130.

It should be understood that MUX 121 allows the DELAY input of delay element 130 to be set by circuitry external to variable delay system 100. For example, after calibration control 140 determines a setting for the RANGE input of delay element 130, external circuitry may set the DELAY input of delay element 130 in order to control the delay between SIG_IN and DEL_OUT. This external circuitry that sets the delay between SIG_IN and DEL_OUT may be part of a calibration loop not shown in FIG. 1. The external circuitry that sets the delay between SIG_IN and DEL_OUT may be part of a calibration loop described hereinafter.

The output of variable delay element 130 (signal/node DEL_OUT) is operatively coupled to a first input of calibration control 140. DEL_OUT is also operatively coupled to an output port of variable delay system 100. The output of phase shift 110 (signal/node CK2) is operatively coupled to a second input of calibration control 140. Calibration control 140 can optionally be operatively coupled to phase shift 110 in order to set a relative delay between CK1 and CK2. A first input to MUX 121 is received from calibration control 140. A second input to MUX 121 can be controlled external to delay system 100 and/or delay circuit 160. When MUX 121 is configured accordingly, calibration control 140 is operatively coupled to, and sets, the DELAY input of variable delay element 130. This allows calibration control 140 to set the DELAY input of variable delay element 130 while calibration control operates to select a value for the RANGE input of variable delay element 130. Calibration control 140 is operatively coupled to, and sets, the RANGE input of variable delay element 130.

The DELAY input to variable delay 130 is illustrated in FIG. 1 as an M bit digital value. The value of DELAY sets the amount of delay provided by delay element 130 from delay element 130's input (DEL_IN) to delay element 130's output (DEL_OUT). The RANGE input to variable delay 130 is illustrated in FIG. 1 as an N bit digital value. The value of RANGE sets the range of delays that can be provided by delay element 130. In other words, the value of RANGE can determine the difference between a minimum delay provided by delay element 130 when DELAY is set to provide a minimum possible delay and a maximum delay provided by delay element 130 when DELAY is set to provide a maximum possible delay. For example, if DELAY=0x00h causes delay element 130 to provide a minimum possible delay, and DELAY=0x3fh causes delay element 130 to provide a maximum possible delay, the value of the RANGE input to delay element 130 determines the difference between the delay from DEL_IN to DEL_OUT provided when DELAY=0x00h and the delay from DEL_IN to DEL_OUT provided when DELAY=0x3fh. In other words, the delay from DEL_IN to DEL_OUT when DELAY=0x3Fh minus the delay from DEL_IN to DEL_OUT when DELAY=0x00h is determined by the value of RANGE. In an embodiment, delay element 130 includes a chain of current starved inverters.

In an embodiment, SIG_IN is used as the input to variable delay system 100 when variable delay system 100 is in normal operation (i.e., when variable delay system 100 is not in a calibration type mode). Likewise, in normal operation, OP_DEL_IN[0:M−1] is used as the input that controls the delay of delay element 130 (and thus the delay of delay circuit 160).). Accordingly, for the purposes of this discussion, it should be understood that MUX 120 is being controlled to pass the signal from MUX 120's first input (i.e., CK1) to the output of MUX 120, and MUX 121 is being controlled to select calibration control 140 to set the DELAY input of delay element 130.

In an embodiment, phase shift 110 controls timing reference CK2 relative to timing reference CK1. In other words, by controllably shifting the phase of CK1 to produce CK2, phase shift 110 sets a relative delay between CK1 and CK2. This relative delay between CK1 and CK2 can be used by calibration control 140 to set the RANGE input of delay element 130 such that the adjustable delay range provided by delay element 130 is matched to the relative delay between CK1 and CK2. The adjustable delay range is the difference, at a given RANGE setting, between the maximum delay that can be provided by delay element 130 and the minimum delay that can be provided by delay element 130. It should be understood that the relative delay between CK1 and CK2 can be aliased by one or more clock periods. In other words, for example, if the period of CK1 and CK2 is tCK, the relative delays of 2*tCK+Δ and 1*tCK+Δ can both result in an adjustable delay range of Δ. Whether the relative delays of 2*tCK+Δ and 1*tCK+Δ both result in an adjustable delay range of Δ may depend upon the range of delays provided by delay element 130 (e.g., whether the range of delays provided by delay element 130 is greater than tCK.)

Calibration control 140 can match the range of delay element 130 by adjusting the RANGE input of delay element 130 to minimize timing difference between DEL_OUT and CK2. For example, calibration control 140 can first set DELAY to the value that provides a minimum delay through delay element 130. Phase shift 110 may then be controlled by calibration control 140 to minimize the timing difference between DEL_OUT and CK2. When the timing difference between DEL_OUT and CK2 is minimized (or zero), phase shift 110 is providing a baseline phase shift that is equal to (or approximately equal to) the minimum delay of delay element 130.

It should be understood that the minimum delay of delay element 130 can be more than one clock period of CK2. In these cases, the timing difference between DEL_OUT and CK2 can be minimized relative to an integer multiple of the clock period of CK2. For example, if the period of CK1 and CK2 is tCK, and the minimum delay of delay element 130 was more than 1*tCK and less than 2*tCK, the timing the timing difference between DEL_OUT and CK2 can be minimized relative to 1*tCK. Likewise, if the minimum delay of delay element 130 was more than 2*tCK and less than 3*tCK, the timing difference between DEL_OUT and CK2 can be minimized relative to 2*tCK, and so on.

Calibration control 140 can then adjust the delay provided by phase shift 110 by an amount equal to the desired maximum range to be provided by delay element 130. For example, calibration control 140 can control phase shift 110 to advance CK2 by 180° (i.e., ½ of a clock period) relative to CK1. Calibration control 140 can then set DELAY to the value that provides a maximum delay through delay element 130 and adjust the RANGE input of delay element 130 to minimize the time difference between DEL_OUT and CK2. Because each adjustment of the RANGE input may alter the minimum delay that can be provided by delay element 130, each time the RANGE input is adjusted, calibration control 140 may repeat the process of setting DELAY to the value that provides a minimum delay through delay element 130 and controlling phase shift 110 to re-align DEL_OUT and CK2, thus iteratively converging to the desired adjustable delay range between minimum and maximum DELAY settings.

In an embodiment, calibration control 140 starts the RANGE input at a value that provides a minimum range and iteratively incrementally adjusts the RANGE input of delay element 130 until the timing difference between DEL_OUT and CK2 is minimized (while CK2 is delayed relative to CK1 by an amount that corresponds to the desired maximum range to be provided by delay element 130.) This corresponds to a linear search for the desired RANGE input. In another embodiment, calibration control 140 may use other search algorithms (e.g., binary search) to find the RANGE input value that corresponds to the desired delay range to be provided by delay element 130.

In FIG. 1, variable delay system 100 is illustrated without integrated circuit boundaries or functional block boundaries. Accordingly, it should be understood that while all of the elements of variable delay system 100 may be included in a single integrated circuit, other configurations are possible. For example, CK1 and CK2 may be provided from a source that is external to an integrated circuit that includes other elements of variable delay system 100. In another example, calibration control 140 may reside on an integrated circuit (e.g., a memory controller) that is separate from the integrated circuit where some (or all) of the rest of the elements of variable delay system 100 reside (e.g., a memory device). Likewise, calibration control 140 may be separate from bitslices or other circuitry that includes delay circuit 160 and/or delay element 130.

Figure 2:
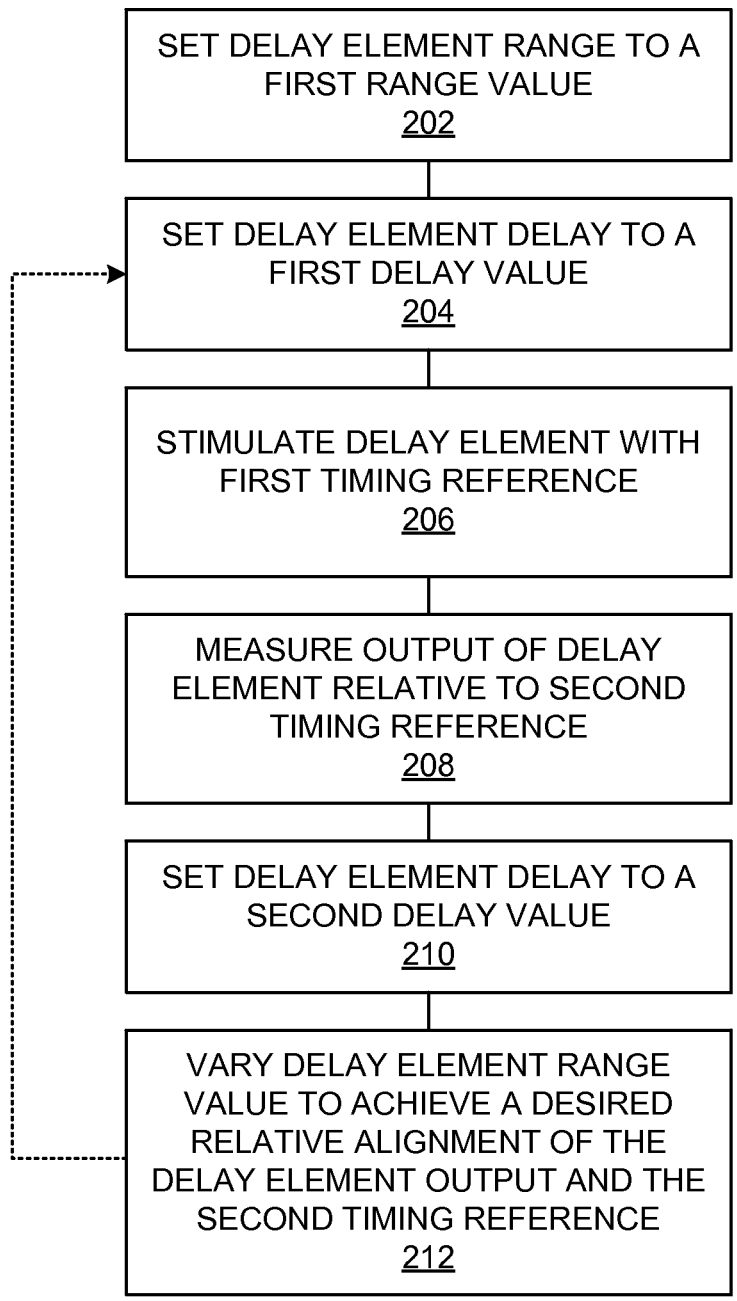
FIG. 2 is a flowchart illustrating a method of calibrating a variable delay element.

FIG. 2 is a flowchart illustrating a method of calibrating a variable delay system. The steps illustrated in FIG. 2 may be performed by one or more elements of variable delay system 100. A delay element is set to a first range value (202). For example, calibration control 140 may set an initial value for the RANGE input of delay element 130 as a starting point for a search for a RANGE value that corresponds to the desired range to be provided by delay element 130. As a starting point, this value may be, for example, a value that corresponds to a minimum, a maximum, or an intermediate (e.g., middle) point in the values that are valid for the RANGE input of delay element 130.

The delay element delay is set to a first delay value (204). For example, the DELAY input may be set to a value that causes delay element 130 to provide the minimum delay that delay element 130 is capable of providing for the current RANGE input value. In another example, the DELAY input may be set to a value that that causes delay element 130 to provide a non-minimum delay. In other words, if it is desired to set the delay range of delay element 130 over an arbitrary range of values for the DELAY input (e.g., from ¼ to ¾ of the available range of values for the DELAY input), the DELAY input can be set to the minimum value of this arbitrary range (e.g., the value corresponding to ¼ of the full scale of available range values).

The delay element is stimulated with a first timing reference (206). For example, delay element 130 may be stimulated by CK1. Delay element 130 may be stimulated by CK1 by setting the control input of MUX 120 to select CK1. The output of the delay element is measured relative to a second timing reference (208). For example, calibration control 140 can measure a transition on the output of delay element 130 (DEL_OUT) relative to a corresponding transition on CK2. In an embodiment, these measurements can be performed using circuits that are external to delay circuit 160. For example, the relative delay between CK1 and CK2 as output by phase shift 110 can be swept over a range of relative timings by phase shift 110. At each of these relative timings, it can be determined whether CK2 transitioned first, DEL_OUT transitioned first, or both CK2 and DEL_OUT transitioned effectively simultaneously. The relative timing difference created by phase shift 110 (or the control input that created that relative timing) when CK2 and DEL_OUT are transitioning effectively simultaneously can be used as a measure of the delay through delay element 130.

The delay element delay is set to a second delay value (210). For example, the DELAY input may be set to a value that causes delay element 130 to provide the maximum delay that delay element 130 is capable of providing for the current RANGE input value. In another example, the DELAY input may be set to a value that that causes delay element 130 to provide a non-maximum delay. In other words, if it is desired to set the delay range of delay element 130 over an arbitrary range of values for the DELAY input (e.g., from ¼ to ¾ of the available range of values for the DELAY input), the DELAY input can be set to the maximum value of this arbitrary range (e.g., the value corresponding to ¾ of the full scale of available range values).

The delay element range value is varied to achieve a desired relative alignment of the delay element output and the second timing reference (212). For example, while the DELAY input of delay element 130 is set to a value that corresponds to delay element 130 providing the maximum delay, calibration control 140 may employ a search algorithm to adjust the RANGE input of delay element 130 to minimize the delay between DEL_OUT and CK2. In another embodiment, because each adjustment of the RANGE input may alter the delay provided by delay element 130 when the delay element delay is set to the first (i.e., minimum delay) value, each time the delay element range value is adjusted, calibration control 140 may loop back to step 204 in order to measure a new relative delay provided by delay element 130 when the delay element delay is set to the first value.

With delay element 130 providing the maximum delay, calibration control 140 may employ a search algorithm to adjust the RANGE input of delay element 130 to minimize the timing difference between DEL_OUT and CK2. In other words, each time the RANGE value is adjusted, calibration control 140 may re-measure the relative delay between CK2 and DEL_OUT that results when DELAY is at the first (i.e., minimum or arbitrary minimum as the case may be) value. This re-measured value can be used as the baseline minimum delay to be subtracted from the maximum delay in order to determine the adjustable delay range.

In another embodiment, if the minimum delay is known or is determined to be not significant, the baseline minimum delay need not be re-measured every time the RANGE input is adjusted.

Figure 3:
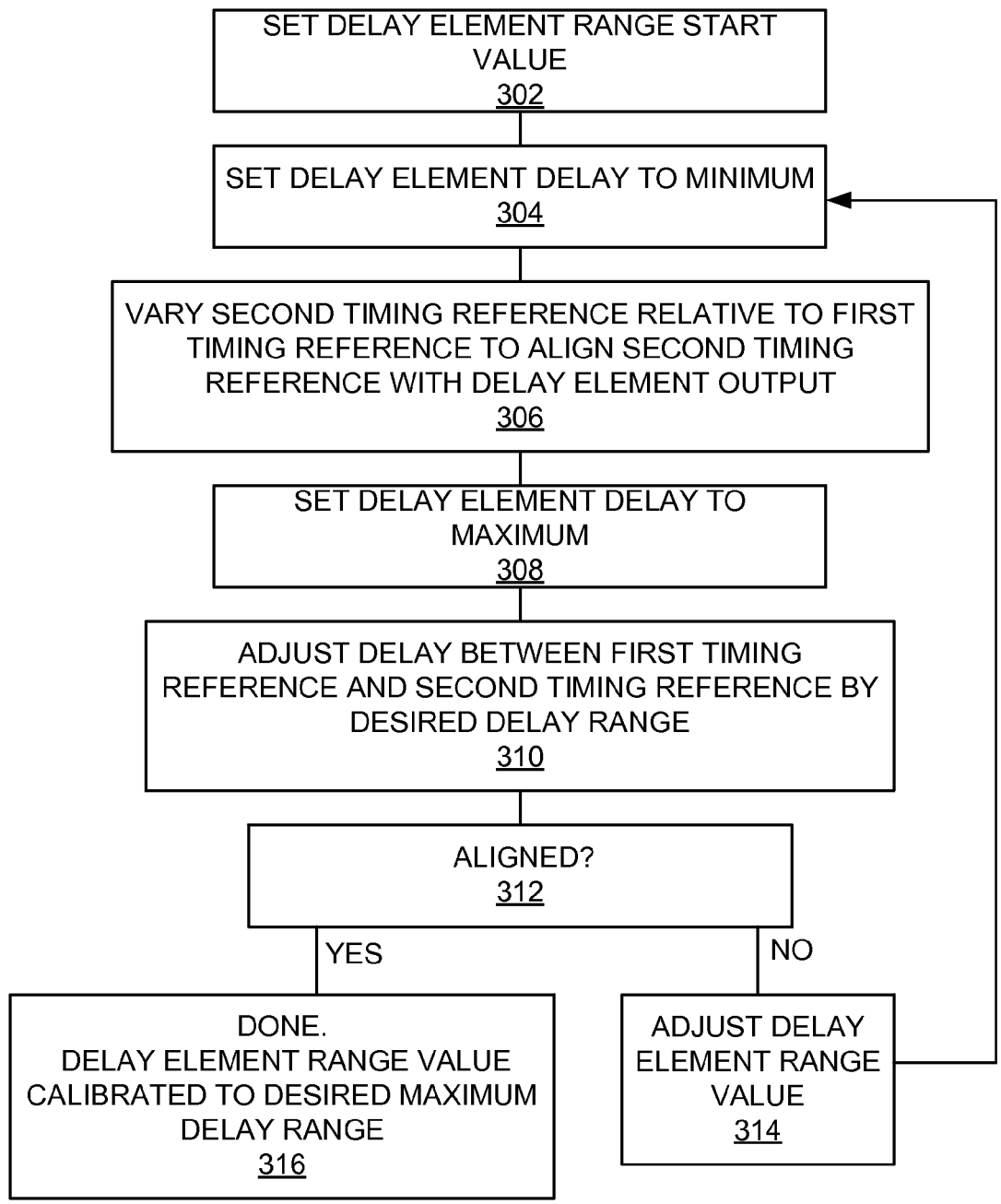
FIG. 3 is a flowchart illustrating a method of calibrating the range of a delay element.

FIG. 3 is a flowchart illustrating a method of calibrating the range of a delay element. The steps illustrated in FIG. 3 may be performed by one or more elements of variable delay system 100. A delay element range is set to a starting value (302). For example, calibration control 140 may set the RANGE input of delay element 130 to the value that causes delay element 130 to produce a minimum range of delays over the full-range of DELAY input values (i.e., from a minimum valid DELAY input value to a maximum valid DELAY input value).

A delay element delay is set to a minimum (304). For example, calibration control 140 may set the DELAY input of delay element 130 to the minimum valid DELAY input value. The second timing reference is varied relative to the first timing reference to align the second timing reference with the delay element output (306). For example, calibration control 140 may vary CK2 relative to CK1 (using phase shift 110) in order to align the transitions of CK2 with the transitions of DEL_OUT. When the transitions of CK2 are aligned with the transitions of DEL_OUT, the relative delay from CK1 to CK2 corresponds to the delay provided by delay element 130. Thus, the phase shift 110 control setting used when CK2 is aligned with DEL_OUT can be used as a measure of the delay provided by delay element 130. When the DELAY input of delay element 130 is set to the minimum delay over the selected range of DELAY input values, and CK2 and DEL_OUT are aligned using phase shift 110, the phase shift 110 control setting is a measure of this minimum delay that results from this DELAY input value.

The delay element delay is set to a maximum (308). For example, calibration control 140 may set the DELAY input of delay element 130 to the maximum valid DELAY input value. The delay between the first timing reference and the second timing reference is adjusted by a desired delay range (310). For example, calibration control 140 may control phase shift 110 to increase the relative delay between CK1 and CK2 by an amount equal to (or approximately equal to) the desired delay range. For example, if the desired delay range is ½ clock cycle of CK1 (and CK2), then phase shift 110 may be controlled to delay CK2 relative to CK1 by an additional ½ clock cycle from the setting in block 306 (where DELAY is set to the minimum and CK2 and DEL_OUT are aligned).

In block 312, it is determined whether the second timing reference and the delay element output are aligned. If the second timing reference and the delay element output are aligned, flow proceeds to block 316. If the second timing reference and the delay element output are not aligned, flow proceeds to block 314. For example, if CK2 and DEL_OUT are aligned (under the conditions where the relative delay between CK1 and CK2 is equal to the minimum delay plus the desired delay range and DELAY is set to the corresponding maximum delay value), then the RANGE input value is calibrated to the desired delay range and the process is done. If CK2 and DEL_OUT are not aligned under these conditions, further adjustments to the RANGE input value are necessary.

In block 316, the process ends with the delay element range value calibrated to the desired delay range (316). In other words, when the relative delay between CK1 and CK2 is set to be equal to the minimum delay produced when DELAY is at its minimum value (which can be more than one clock cycle of CK1 and CK2) plus the desired delay range (which also can be more than one clock cycle of CK1 and CK2), and the DELAY input value is set to its maximum value, the RANGE input value that results in CK2 and DEL_OUT being aligned under these conditions is the RANGE input value that produces a delay range for delay element 130 that is equal to (or approximately equal to) the desired delay range (as specified by the adjustment in the relative delay between CK1 and CK2 made in block 310).

In block 314, the delay range value is adjusted (314). After the delay range value is adjusted, flow proceeds to block 304. For example, the RANGE input value may be increased. Since this change in the RANGE input value may cause a change in the delay provided by delay element 130 when the DELAY input is set to its minimum, flow proceeds to block 304 in order to re-measure the delay provided by delay element 130 when the DELAY input is set to its minimum.

In an embodiment, calibration control 140 may set the RANGE input of delay element 130 to values that cause delay element 130 to produce a minimum range of delays over a selected range instead of the full-range of DELAY input values (i.e., from a selected minimum valid DELAY input value to a selected maximum valid DELAY input value). In this embodiment, the selected minimum and maximum DELAY values are substituted, as appropriate, for one or both of the full-range DELAY input values in the steps illustrated in FIG. 3.

Figure 4A:
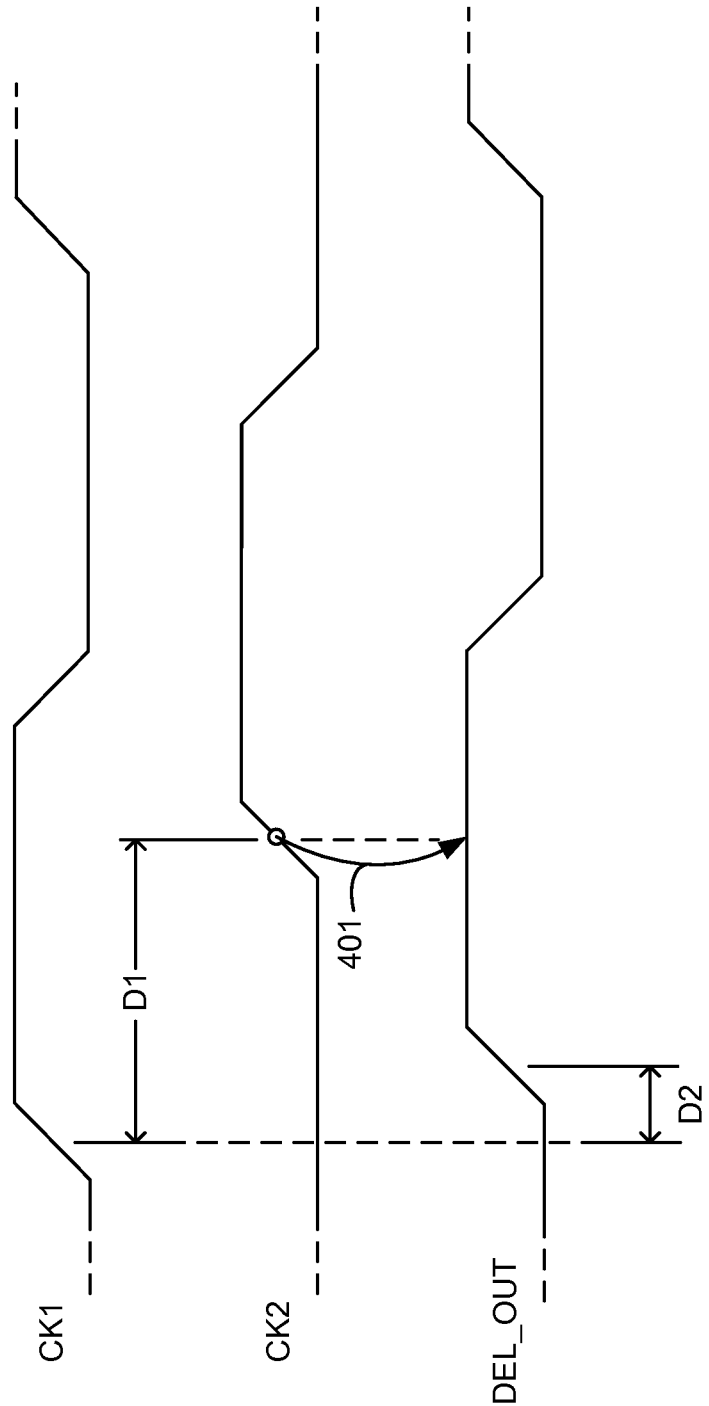

FIGS. 4A-4E are timing diagrams illustrating a process of calibrating the range of a delay element. The signals and timings illustrated in FIG. 4A-4E can be understood as examples of signals, timings, and processes discussed herein. FIG. 4A illustrates a condition where the delay element is set to provide a minimum delay, the delay element range is set to provide a minimum range, and the relative delay between the two timing references are at an arbitrary (i.e., starting and unaligned) relationship. In FIG. 4A, the relative delay between a rising edge of timing reference CK1 and CK2 is D1. The relative delay between timing reference CK1 and the output of the delay element (DEL_OUT) is D2. The rising edge of CK2 occurs during a time when DEL_OUT is stable (i.e., CK2 and DEL_OUT are not aligned). This is illustrated in FIG. 4A by arrow 401. Since the delay element is set to provide a minimum delay, it should be understood that delay D2 is the delay provided by delay element 130 with its delay input set to a minimum value and its range input set to a minimum value. It should also be understood that FIG. 4A can illustrate the relationship of certain signals in delay system 100 after step 304 in FIG. 3.

Figure 4B:
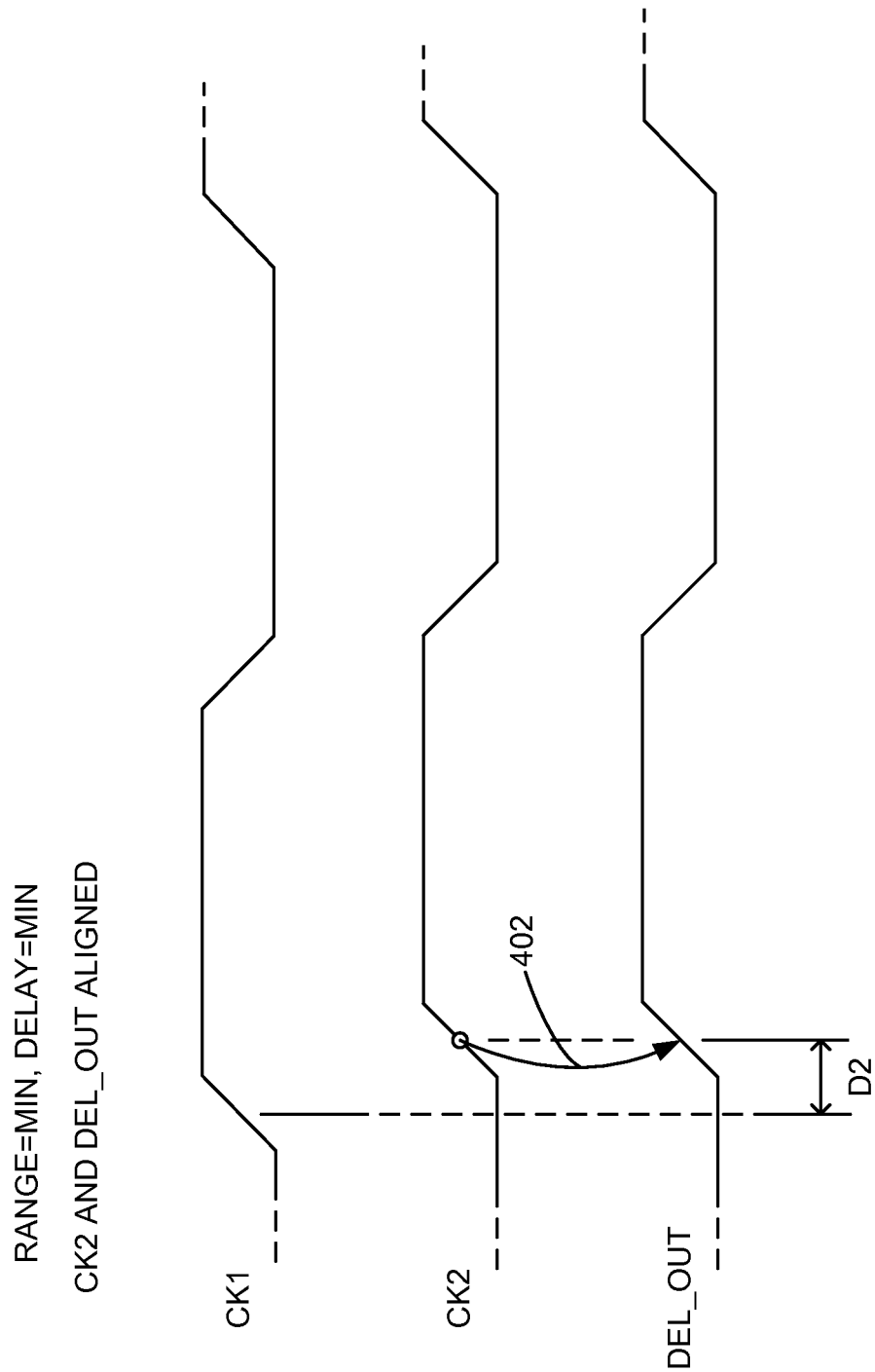

FIG. 4B illustrates a condition where the delay element is set to provide a minimum delay, the delay element range is set to provide a minimum range, and the relative delay between the two timing references have been adjusted to align the second timing reference with the output of the delay element. In FIG. 4B, the rising edge of timing reference CK2 and the rising edge of DEL_OUT are aligned (i.e., the relative delay between DEL_OUT and CK2 is zero or approximately zero). This is illustrated by arrow 402. The relative delay between a rising edge of timing reference CK1 and CK2 is D2. The relative delay between timing reference CK1 and the output of the delay element (DEL_OUT) is also D2. The rising edge of CK2 occurs during a time when DEL_OUT is transitioning (i.e., CK2 and DEL_OUT are aligned). In FIG. 4B, D2 is illustrated as being less than the period of CK1 (and CK2.) However, it should be understood that D2 can be more than one clock period. It should also be understood that FIG. 4B can illustrate the relationship of certain signals in delay system 100 after step 306 in FIG. 3.

FIG. 4C illustrates a condition where the delay element is set to provide a maximum delay, the delay element range is set to provide a minimum range, and the relative delay between the two timing references has been adjusted (e.g., increased) by the desired delay range. In FIG. 4C, the relative delay between a rising edge of timing reference CK1 and CK2 is D2+D3. D2, as discussed previously, is the delay provided by delay element 130 with its range input set to a minimum value. D3 is the desired delay range. Accordingly, the desired delay range (D3) is added to the delay (D2) in order to provide an overall relative delay between CK1 and CK2 that will accomplish the goal of providing a delay range of D3. The relative delay between timing reference CK1 and the output of the delay element (DEL_OUT) is D4. Note that D4 is not equal to D2 because the delay element is set to provide a maximum delay (as opposed to the minimum delay illustrated in the previous FIGS. 4A and 4B). The rising edge of CK2 occurs during a time when DEL_OUT is stable (i.e., CK2 and DEL_OUT are not aligned). This is illustrated in FIG. 4C by arrow 403. Since the delay element is set to provide a maximum delay, it should be understood that delay D4 is the delay provided by delay element 130 with its delay input set to a maximum value and its range input set to a minimum value. It should also be understood that FIG. 4C can illustrate the relationship of certain signals in delay system 100 after step 308 in FIG. 3.

Figure 4D:
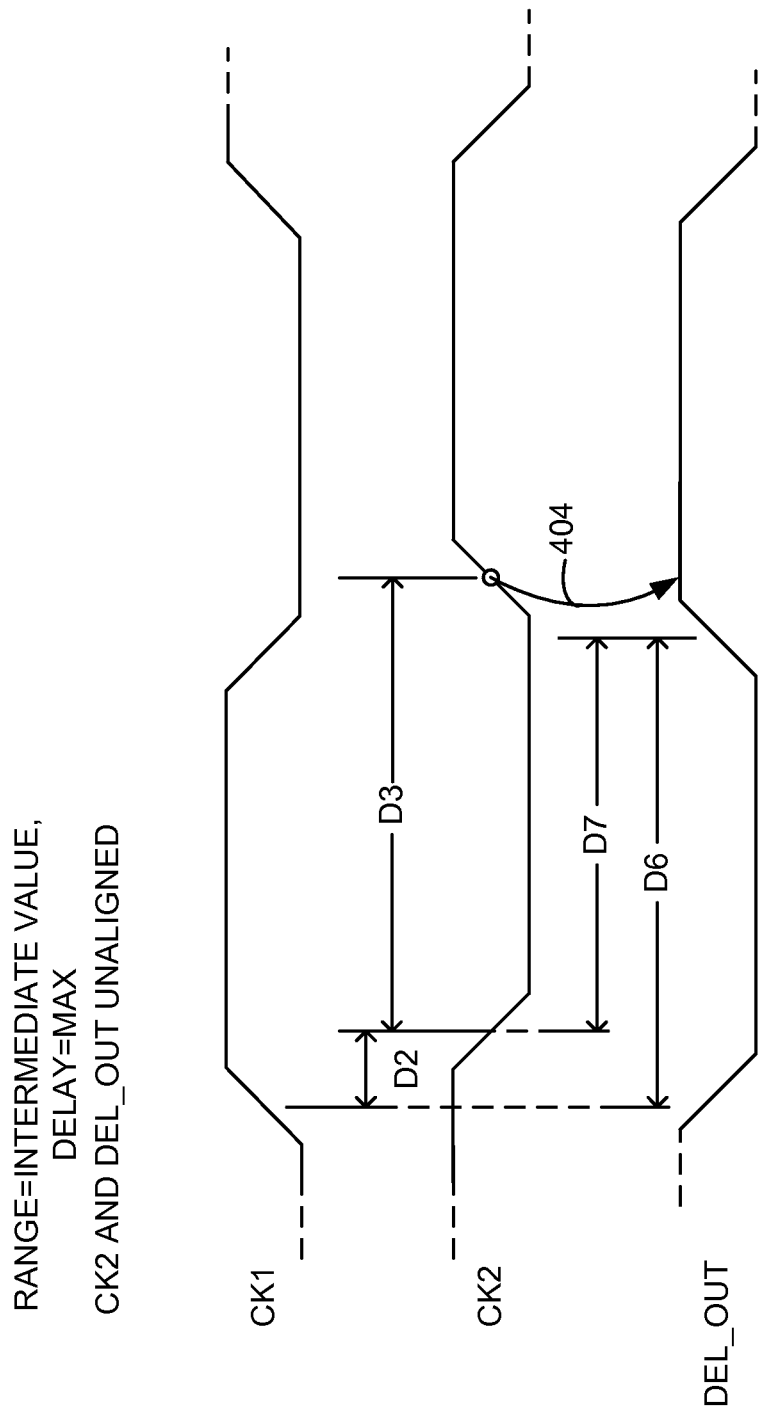

FIG. 4D illustrates a condition where the delay element is set to provide a maximum delay, the delay element range is set to provide an intermediate value, and the relative delay between the two timing references is set to the minimum delay plus the desired delay range. In FIG. 4D, the relative delay between a rising edge of timing reference CK1 and CK2 is D2+D3. The relative delay between timing reference CK1 and the output of the delay element (DEL_OUT) is D6. The rising edge of CK2 occurs during a time when DEL_OUT is stable (i.e., CK2 and DEL_OUT are not aligned). This is illustrated in FIG. 4D by arrow 404. Since the delay element is set to provide a maximum delay, it should be understood that delay D6 is the delay provided by delay element 130 with its range input set to a maximum value and its range input set to an uncalibrated intermediate value. It should also be understood that FIG. 4D can illustrate the relationship of certain signals in delay system 100 after some adjustments are made in step 310 of FIG. 3.

Figure 4E:
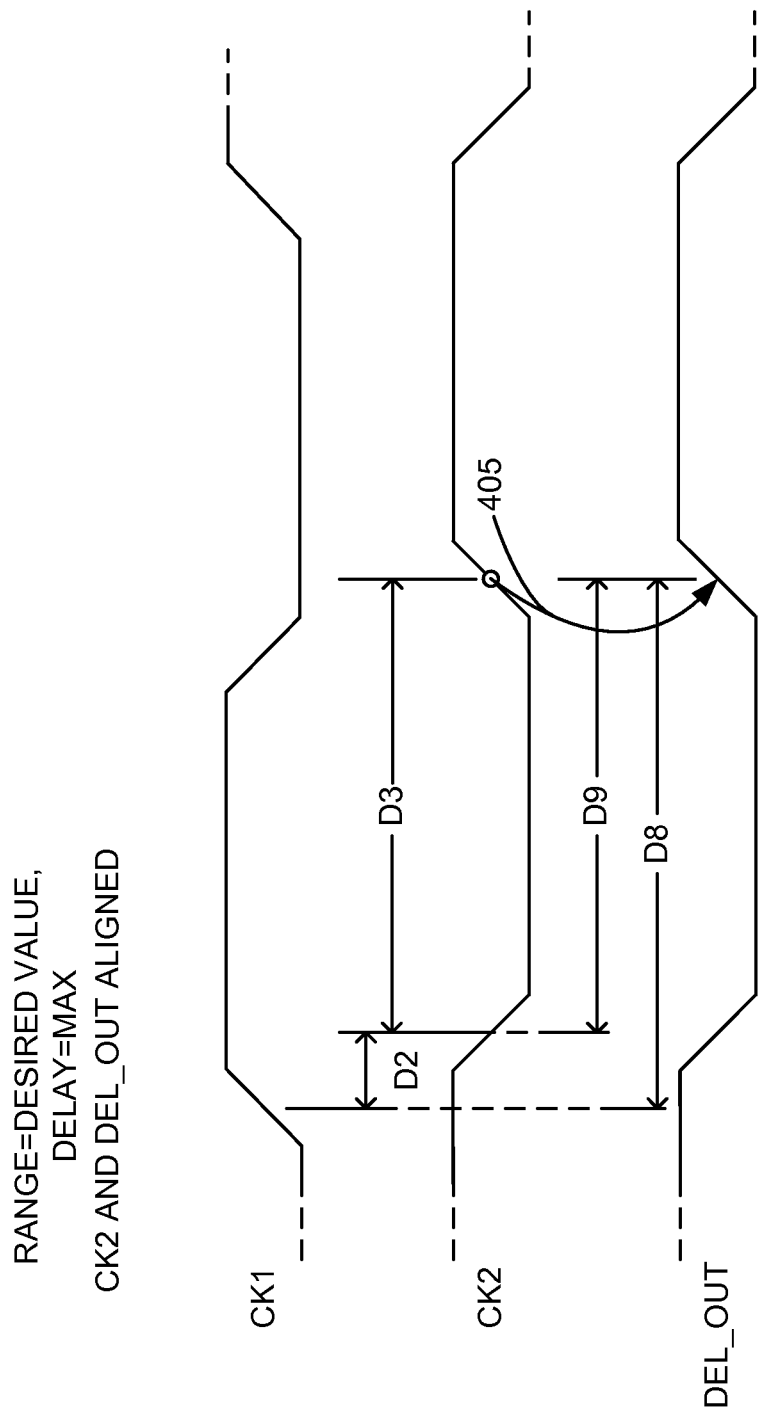

FIG. 4E illustrates a condition where the delay element is set to provide a maximum delay, the delay element range is set to provide the desired range, and the relative delay between the two timing references is set to the minimum delay plus desired delay range. In FIG. 4E, the relative delay between a rising edge of timing reference CK1 and CK2 is D2+D3. The relative delay between timing reference CK1 and the output of the delay element (DEL_OUT) is D8. The rising edge of CK2 occurs in alignment with DEL_OUT. This is illustrated in FIG. 4E by arrow 405. Since the delay element is set to provide a maximum delay, it should be understood that delay D8 is the maximum delay provided by delay element 130 with its range input set to the value that will provide the desired range of delays (as specified by D3). It should also be understood that FIG. 4E can illustrate the relationship of certain signals in delay system 100 after the process illustrated in FIG. 3 completes (i.e., at step 316).

Figure 5:
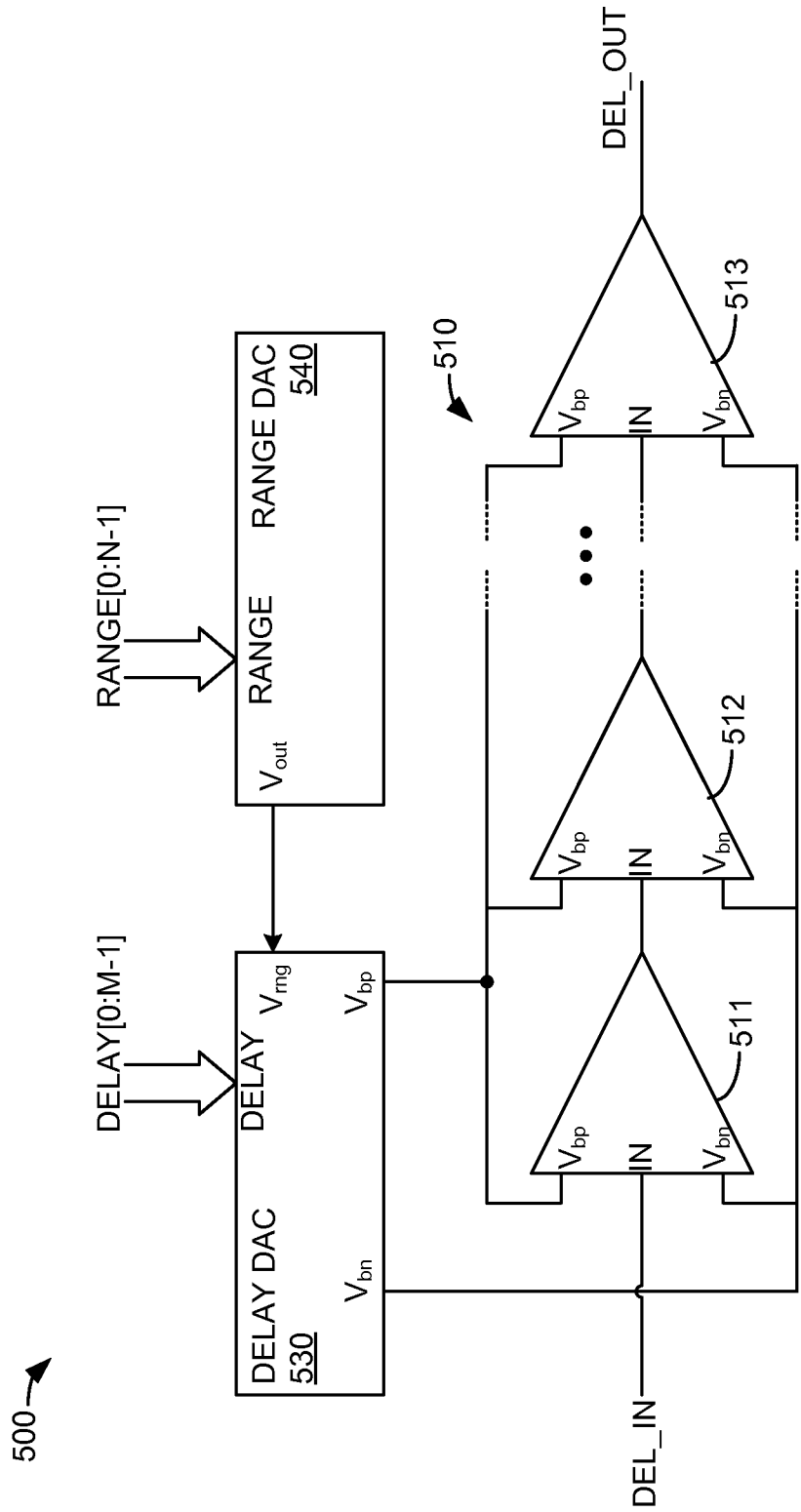
FIG. 5 is a block diagram of an example delay element.

FIG. 5 is a block diagram of an example delay element. In an example, delay element 500 can be used as delay element 130 illustrated in FIG. 1. However, it should be understood that delay element 500 is merely an example and that other digitally controlled delay line circuits can be used as the delay element(s) described herein. Delay element 500 comprises current-starved inverter delay element 510, delay digital-to-analog converter (DAC) 530, and range DAC 540. Delay element 510 includes current-starved inverters 511-513. Inverter 511 receives the input signal to delay element 500, DEL_IN. The output of inverter 511 is connected to the input of inverter 512; the output of inverter 512 is connected to the next inverter (not shown in FIG. 5) in the chain. The output of inverter 513 is the output of delay element 500, DEL_OUT. Although three inverters are shown in FIG. 5, it should be understood that delay element 510 may include an arbitrary number of inverters 511-513.

Each of inverters 511-513 includes bias input $V_{bp}$ and $V_{bn}$. $V_{pb}$ and $V_{bn}$ set the delay of each of inverters 511-513 by establishing the current available to effect a signal transition. Accordingly, the voltages at $V_{bp}$ and $V_{bn}$ set the total delay provided by delay element 510. Each of inverters 511-513 receives $V_{bp}$ and $V_{bn}$ via outputs from delay DAC 530. Delay DAC 530 sets $V_{bp}$ and $V_{bn}$ based on the M-bit value of DELAY[0:M−1]. Thus, the value of DELAY[0:M−1] determines the delay from DEL 1N to DEL_OUT.

Delay DAC 530 receives a range bias voltage $V_{rng}$ that determines the range of voltages for $V_{bp}$ and $V_{bn}$ that delay DAC 530 will output in response to full-scale values input to DELAY[0:M−1]. In other words, $V_{rng}$ determines the minimum and maximum voltages for $V_{bp}$ and $V_{bn}$ that will be output by delay DAC 530 when corresponding minimum and maximum DELAY[0:M−1] values are input to delay DAC 530. Thus, $V_{rng}$ determines the minimum and maximum delay that can be provided by delay DAC 530 over the full-range of DELAY[0:M−1] values.

$V_{rng}$ is received by delay DAC 530 from range DAC 540. Range DAC 540 sets $V_{rng}$ based on the N-bit value of RANGE [0:N−1]. Thus, the value of RANGE[0:N−1] determines the minimum and maximum delay that can be provided by delay DAC 530 over the full-range of DELAY[0:M−1] values. An example relationship of the delay range set by RANGE[0:N−1] is further illustrated in FIG. 6.

Figure 6:
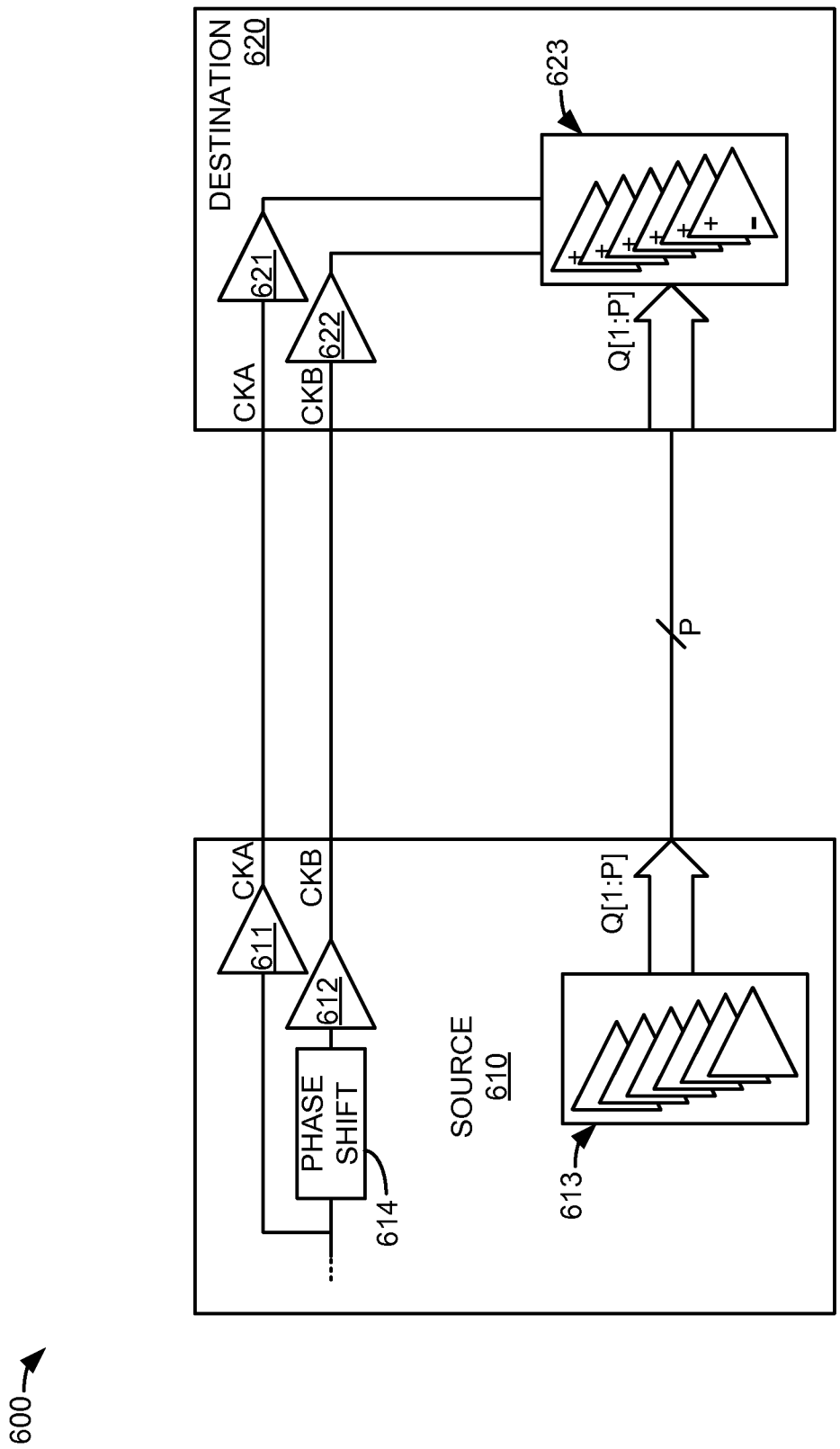
FIG. 6 is a block diagram illustrating a memory system.

FIG. 6 is a block diagram illustrating a data communication system. Communication system 600 comprises source 610 and destination 620. Source 610 includes driver 611, driver 612, drivers 613, and phase shift 614. Source 610 also includes timing reference ports CKA and CKB that are driven by driver 611 and driver 612, respectively. Source 610 also includes P number of signal ports Q[1:P] that are driven by drivers 613. Source 610 may also include receivers (not shown in FIG. 6) for receiving signals from destination 620 via the Q[1:P] signal ports. Destination 620 includes receiver 621, receiver 622, and receivers 623. Timing reference ports CKA and CKB of source 610 are operatively coupled to destination 620 ports CKA and CKB, respectively. Signal ports Q[1:P] of source 610 are operatively coupled to ports Q[1:P] of destination 620, respectively. Thus, receiver 621 and receiver 622 of destination 620 receive the CKA and CKB signals, respectively, from source 610. Receiver 621 and receiver 622 of destination 120 buffer and/or generate internal clocks or strobes derived from the CKA and CKB signals, respectively, from source 610. Receivers 623 of destination 620 receive the Q[1:P] signals from source 610. Receivers 623 may sample Q[1:P] based on CKA and/or CKB. Destination 620 may also include drivers (not shown in FIG. 6) for driving signals to source 610 via the Q[1:P] signal ports.

Source 610 and destination 620 may comprise circuitry on integrated circuit type devices, such as one commonly referred to as a "chip". Source 610 and destination 620 may be blocks of circuitry on the same integrated circuit. Source 610 and destination 620 may be parts or blocks of separate integrated circuit devices.

For example, Source 610 and/or destination 620 may be part of a memory controller and/or a memory device. A memory controller, such as memory controller containing, for example, destination 610, manages the flow of data going to and from memory devices (e.g. destination 620.) For example, a memory controller may be a northbridge chip, an application specific integrated circuit (ASIC) device, a graphics processor unit (GPU), a system-on-chip (SoC) or an integrated circuit device that includes many circuit blocks such as ones selected from graphics cores, processor cores, and MPEG encoder/decoders, etc. A memory device (e.g., source 610) can include a dynamic random access memory (DRAM) core or other type of memory cores, for example, static random access memory (SRAM) cores, or non-volatile memory cores such as flash. In addition although the embodiments presented herein describe memory controller and components, the instant apparatus and methods may also apply to chip interfaces that effectuate signaling between separate integrated circuit devices.

It should be understood that signal ports Q[1:P] of both source 610 and destination 620 may correspond to any input or output ports of source 610 or destination 620 that rely on a timing reference signal communicated via one or more of timing reference ports CKA and/or CKB for synchronization. For example, signal ports Q[1:P] can correspond to bidirectional data ports used to communicate read and write data between source 610 and destination 620. The data ports may also be referred to as "DQ" pins. Thus, for a destination 620 that reads and writes data up to 16 bits at a time, signal ports Q[1:P] can be seen as corresponding to ports DQ[0:15]. In another example, signal ports Q[1:P] can correspond to one or more unidirectional command/address (C/A) bus ports. Signal ports Q[1:P] can correspond to one or more unidirectional control ports. Thus, signal ports Q[1:P] on source 610 and destination 620 may correspond to ports such as CS (chip select), a command interface that includes timing control strobes such as RAS and CAS, address pins A[0:Y] (i.e., address pins carrying address bits), DQ[0:X] (i.e., data ports carrying data bits), etc., and other signal conductor ports in past, present, or future devices.

In an embodiment, the signals output by timing reference ports CKA and CKB can be periodic at a stable frequency and have a phase relationship to each other that is set by phase shift 614. Because CKA and CKB are periodic, CKA and CKB may be labeled as clock signals (and thus drivers 611 and 612 may be labeled as clock drivers; receivers 621 and 622 may be labeled as clock receivers). However, the signals output by timing reference ports CKA and CKB may instead be one of respective intermittent clock signals or strobe signals that maintain the phase relationship set by phase shift 614. Thus, CKA and CKB can be labeled as strobes, and drivers 611 and 612 may be referred to as strobe drivers. Receivers 621 and 622 may be labeled as strobe receivers. Therefore, it should be understood that CKA and CKB may be labeled as clocks, strobes, etc., but can be any type of timing reference signal(s).

In an embodiment, each of receivers 623 may include an instance of a variable delay element. Examples of variable delay elements that may be part of each of receivers 623 include variable delay element 130 and delay element 500. The variable delay elements of receivers 623 may be used to adjust one or more timings internal to a respective receiver. These internal timing(s) may be adjusted to account for signal and/or clock/strobe distribution mismatches. In short, the variable delay elements of receivers 623 may be used to adjust one or more timings internal to a respective receiver in order to ensure reliable sampling/reception of the signals on signal ports Q[1:P] in response to one or more of CKA and/or CKB.

In another embodiment (not shown in FIG. 6), drivers in source 610 and/or destination 620 may include an instances of a variable delay element. Examples of variable delay elements that may be part of these drivers include variable delay element 130 and delay element 500. The variable delay elements of these drivers may be used to adjust one or more timings internal to a respective driver. These internal timing(s) may be adjusted to account for signal and/or clock/strobe distribution mismatches. In short, the variable delay elements of these drivers may be used to adjust one or more timings internal to a respective driver in order to ensure reliable communication of the signals on signal ports Q[1:P].

As discussed herein, the range of the variable delay elements in each of receivers 623 may be set to a desired range. In an embodiment, this desired range may be specified according a phase shift set by phase shift 614. In another embodiment, this desired range may be set by a phase shift created internal to destination 620. Once the range of each of the variable delay elements in receivers 623 are set as discussed herein, the delay variation between any two of these variable delay elements, for a given delay element delay input value is reduced.

Figure 7:
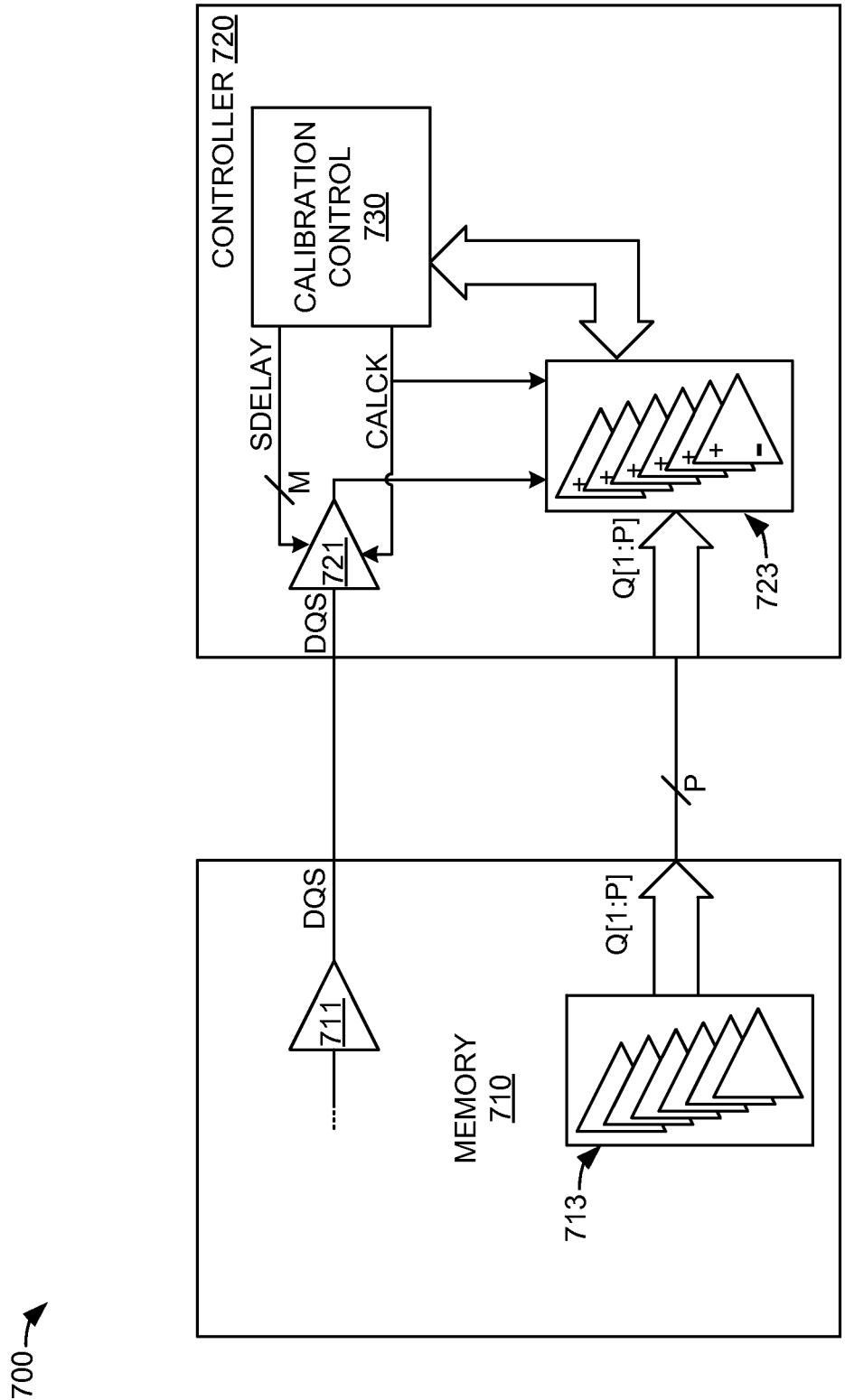
FIG. 7 is a block diagram illustrating a memory system.

FIG. 7 is a block diagram illustrating a memory system. Memory system 700 comprises memory device 710 and controller 720. Memory 710 includes driver 711, and drivers 713. Memory 710 also includes strobe port DQS that is driven by driver 711. Memory 710 also includes P number of signal ports Q[1:P] that are driven by drivers 713. Memory 710 may also include receivers (not shown in FIG. 7) for receiving signals from controller 720 via the Q[1:P] signal ports.

Controller 720 includes receiver 721, receivers 723, and calibration control 730. Calibration control 730 is operatively coupled to receivers 723. Calibration control 730 is operatively coupled to receivers 723 and receiver 721 to provide receivers 723 and receiver 721 with a clock signal CALCK. Calibration control 730 is also operatively coupled to receiver 721 to set a delay element delay. Calibration control 730 sets a delay element internal to receiver 721 using an M-bit value SDELAY.

The output of receiver 721 is operatively coupled to receivers 723 as a strobe signal that causes receivers 723 to sample an input signal. The signal sampled by receivers 723 in response to the output of receiver 721 can be configured to be from a respective signal port Q[1:P], or from CALCK. The signal sampled by receivers 723 is delayed by a respective variable delay element internal to each of receivers 723.

Strobe port DQS of memory 710 is operatively coupled to DQS port of controller 720. Signal ports Q[1:P] of memory 710 are operatively coupled to ports Q[1:P] of controller 720, respectively. Thus, receiver 721 of controller 720 receives DQS signal from memory 710. Receiver 721 can buffer and/or generate internal clocks or strobes derived from the DQS signal from memory 710 or the CALCK signal received from calibration control 730. Receiver 721 provides these internal clocks or strobes derived from the DQS signal or the CALCK signal to receivers 723. Receivers 723 of controller 720 receive the Q[1:P] signals from memory 710. Controller 720 may also include drivers (not shown in FIG. 7) for driving signals to memory 710 via the Q[1:P] signal ports.

It should be understood that signal ports Q[1:P] of both memory 710 and controller 720 may correspond to any input or output pins (or balls) of memory 710 or controller 720 that rely on a timing reference signal communicated via strobe port DQS for synchronization. For example, signal ports Q[1:P] can correspond to bidirectional data pins (or pad means) used to communicate read and write data between memory 710 and controller 720. The data pins may also be referred to as "DQ" pins. Thus, for a memory 710 that reads and writes data up to 16 bits at a time, signal ports Q[1:P] can be seen as corresponding to pins DQ[0:15]. In another example, signal ports Q[1:P] can correspond to one or more unidirectional command/address (C/A) bus ports. Signal ports Q[1:P] can correspond to one or more unidirectional control pins. Thus, signal ports Q[1:P] on memory 710 and controller 720 may correspond to pins such as CS (chip select), a command interface that includes timing control strobes such as RAS and CAS, address pins A[0:Y] (i.e., address pins carrying address bits), DQ[0:X] (i.e., data pins carrying data bits), etc., and other pins in past, present, or future devices.

In an embodiment, each of receivers 723 and receiver 721 may include an instance of a variable delay element. Examples of variable delay elements that may be part of in each of receivers 723 and/or receiver 721 include variable delay element 130 and delay element 500. The variable delay elements of receivers 723 and/or receiver 721 may be used to adjust one or more timings internal to a respective receiver. The variable delay element of receiver 721 may be used to adjust the delay of signal DQS and/or CALCK through receiver 721. The variable delay element of receivers 723 may be used to adjust the delay of a respective signal Q[1:P] before that signal is sampled by the corresponding one of receivers 723 in response to a strobe/clock signal received from receiver 721.

In an embodiment, calibration control 730 configures receiver 721 to receive and relay, through its variable delay element, the signal CALCK. Likewise, calibration control 730 configures receivers 723 to receive CALCK instead of the signals at signal ports Q[1:P]. The delay elements of receivers 723 are set to a predetermined delay value. For example, the delay elements of receivers 723 may be set to an approximate midpoint between the shortest delay and the longest delay that can be provided by the delay elements of receivers 723. While in this configuration, calibration control 730, using SDELAY, varies the delay provided between CALCK and the output of receiver 721. For example, calibration control 730 may sweep SDELAY through a range of values which results in a sweeping of the delay time from CALCK to the output of receiver 721.

Since the delay value input to the delay elements of receivers 723 remains constant while SDELAY is varied, CALCK is configured to be input to the delay elements of receivers 723, and the output of receiver 721 clocks the samplers of each of receivers 723, the output(s) of the samplers of receivers 723 provide indicators of the relative timing of the signal path from CALCK through a respective receiver 723 (including the delay element internal to the respective receiver 723) versus CALCK through receiver 721 (including the delay element internal to receiver 721) to the clock input of a sampler internal to the respective receiver 723.

For example, if a sampler internal to the respective receiver 723 is sampling on a rising edge (i.e., a transition for a logic "0" to a logic "1"), and the sampler registers a "0" logic value, it indicates that the delay along the path from CALCK through receiver 721 (including the delay as set by SDELAY) and to the sampler clock input is less than the delay along the path from CALCK to the receiver and through the delay element internal to the receiver. Likewise, if the sampler internal to the respective receiver 723 that is sampling on the rising edge registers a "1" logic value, it indicates that the delay along the path from CALCK through receiver 721 (including the delay as set by SDELAY) and to the sampler clock input is more than the delay along the path from CALCK to the receiver and through the delay element internal to the receiver.

These indicators of the relative timing of the signal paths along with the varied settings of SDELAY can be used by calibration control 730 as a measure of the relative timings of the delays associated with each of receivers 723. For example, if a first one of receivers 723 registers a "0" logic value when SDELAY is set to 25 and registers a "1" logic value when SDELAY is set to 26, the value 25 (or 26) can be used as a measure of the relative delay to be associated with this first receiver. Likewise, for example, if a second one of receivers 723 registers a "0" logic value when SDELAY is set to 34 and registers a "1" logic value when SDELAY is set to 35, the value 34 (or 35) can be used as a measure of the relative delay to be associated with this second receiver.

It should be understood that these measures are dependent upon the predetermined delay value that the delay elements within receivers 723 were set. In other words, for example, if the delay elements within receivers 723 were set to 32, the measure of 25 associated with the first receiver indicates that the path delay associated with this first receiver is approximately 32−25=7 SDELAY value increments faster than the path delay associated with CALCK reaching this first receiver. Likewise, for example, the measure of 34 associated with the second receiver indicates that the path delay associated with this first receiver is approximately 35−32=3 SDELAY value increments slower than the path delay associated with CALCK reaching this second receiver.

In an embodiment, the measures of the relative path delays associated with receivers 723 can be used to select a setting for SDELAY. This setting of SDELAY can be used when receivers 723 and receiver 721 are configured to receive Q[1:P] and a strobe (DQS) (i.e. normal operation).

For example, if the measure associated with the first receiver (e.g., 25) is the minimum measure associated with any of receivers 723, and the measure associated with the second receiver (e.g., 35) is the maximum measure associated with any of receivers 723, a setting for SDELAY that is associated with the midpoint (e.g., 30) of these two measures may be selected (i.e., [35+25]/2=30). By selecting a setting for SDELAY (i.e., the setting for the variable delay within receiver 721) that is at (or near) the midpoint of the two measures at the highest and lowest extreme (i.e., one is the minimum and one is the maximum), the delay through receiver 721 is set to minimize the maximum difference between the delay through any of receivers 723 to its respective sampler input and the delay from the input to receiver 721 to the sampler clock input of any of receivers 723. Simply put, because the delay elements of receivers 723 were set to their midpoints when the measurements were made, selecting the midpoint (or average) of the minimum and maximum SDELAY settings associated with a transition in sampled values by respective receivers 723 results in an SDELAY setting that positions DQS transitions, as received by receivers 723, at a time that maximizes flexibility in selecting the delay values for the delay elements of receivers 723 (for example, to compensate for pin-to-pin timing skew resulting from mismatched interconnect delays).

Figure 8:
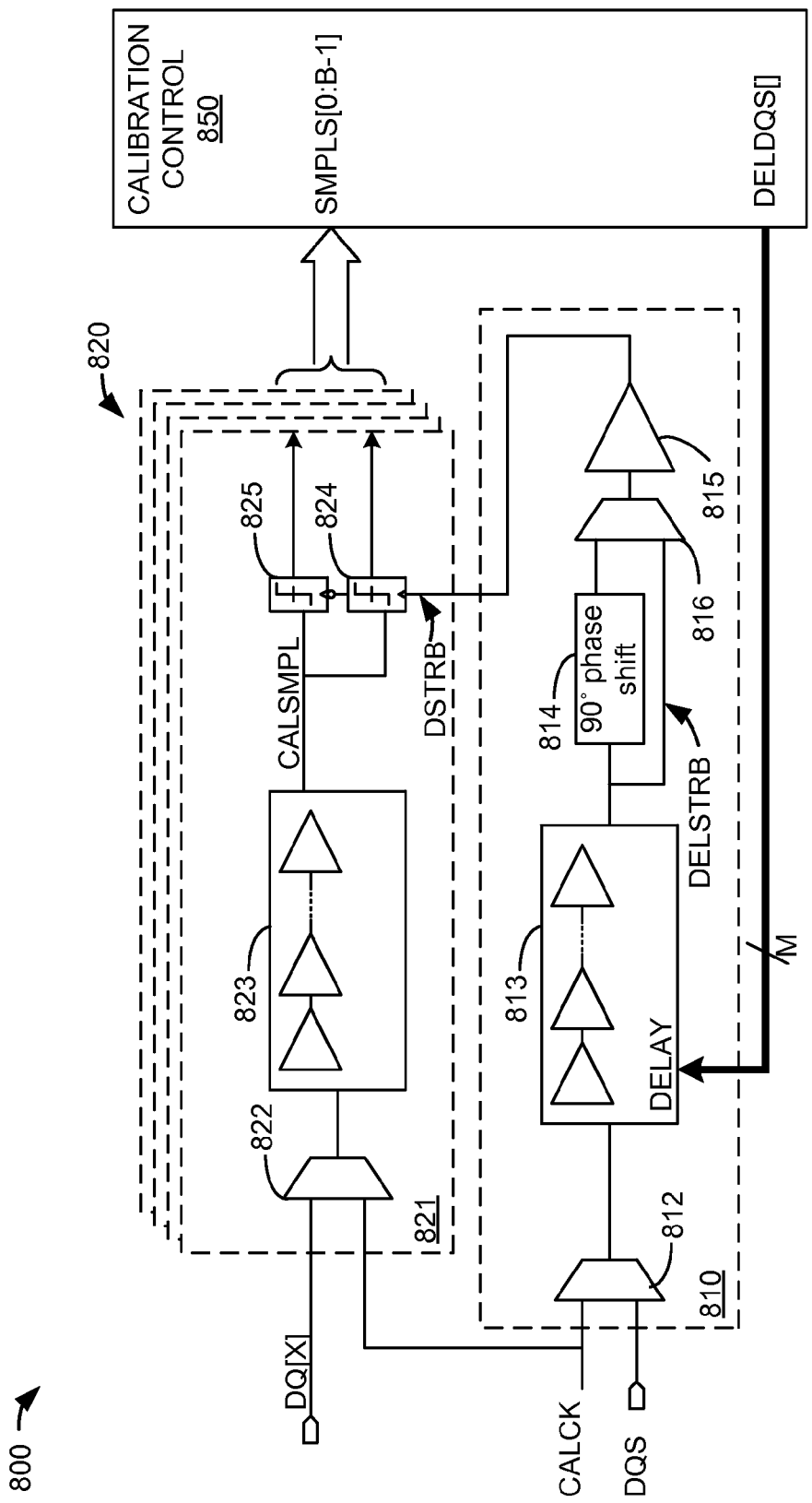
FIG. 8 is a block diagram illustrating a strobe distribution system.

FIG. 8 is a block diagram illustrating a strobe distribution system. In FIG. 8, strobe distribution system 800 comprises strobe receiver 810, receiver bitslices 820, and calibration control 850. Receiver 821 is an example of one of the receiver bitslices 820. Strobe receiver 810 includes 2:1 MUX 812, variable delay element 813, 90° phase shift 814, 2:1 MUX 816, and distribution buffer 815. Receiver 821 includes 2:1 MUX 822, variable delay element 823, sampler 824, and sampler 825. Sampler 824 is configured to sample based on an active high signal. Sampler 825 is configured to sample based on an active low signal.

Receiver 810 is operatively coupled to receive a strobe signal, DQS. For example, receiver 810 may be operatively coupled to receive the DQS strobe signal described with reference to FIG. 9. Strobe signal DQS is operatively coupled to a first input of MUX 812. A second input of MUX 812 is operatively coupled to CALCK. Thus, receiver 810 can be configured to take either the DQS signal or CALCK as an input.

The output of MUX 812 is input to variable delay element 813. The output of variable delay element, DELSTRB, can be directly coupled to the input of distribution buffer 815 (not shown in FIG. 8). In FIG. 8, DELSTRB is coupled through 90° phase shift 814 to a first input of MUX 816. The second input of MUX 816 can receive DELSTRB. The output of MUX 816 can be operatively coupled to the input of distribution buffer 815. Accordingly, receiver 810 can be configured to distribute the output of variable delay element 813 or a 90° phase shifted version of the output of variable delay element 813. The output of distribution buffer 815, DSTRB, is distributed to each of receivers 820.

It should be understood that 90° phase shift 814 corresponds to ½ unit interval in a double-data rate system. Thus, a purpose of distributing a 90° phase shifted version of the output of variable delay element 813 would be to sample nominally in the center of the data bit time. It should also be understood that 90° phase shift 814 may, depending on the relative timing of DQS to DQ[ ]'s, not be used during normal (i.e., non-calibration mode) operation of strobe distribution system 800. In another embodiment (not shown in FIG. 8), 90° phase shift 814 and MUX 816 may not be present in receiver 810.

The DELAY input to variable delay 813 is illustrated in FIG. 8 as an M bit digital value. The value of DELAY sets the amount of delay provided by delay element 813 from delay element 813 input to delay element 813 output (DELSTRB). The M bit delay value (DELDQS[0:M−1]) is received by receiver 810, and variable delay element 813's DELAY input, in particular, from calibration control 850. In an example, delay circuit 160 may be used as variable delay element 813. Thus, DELDQS[0:M−1] may be coupled to OP_DEL_IN[0:M−1] of delay circuit 160 to set the amount of delay provided by delay element 813 (when delay circuit 160 is not calibrating its delay range).

Receivers 820 are each operatively coupled to a respective one of signal ports DQ[ ]. For example, each of receivers 820 may be operatively coupled to receive one of Q[1:P] described with reference to FIG. 9. These connections are illustrated by example by the DQ[X] signal received by receiver 821. DQ[X] is operatively coupled to a first input of MUX 822. A second input of MUX 821 is operatively coupled to CALCK. Thus, receiver 821 (and therefore each of receivers 820) can be configured to take either a DQ[ ] signal or CALCK as an input.

The output of MUX 822 is input to variable delay element 823. The output of variable delay element 823, CALSMPL, is input to sampler 824 and sampler 825. Sampler 824 and sampler 825 each receive a strobe signal, DSTRB, that is distributed by receiver 810. The outputs of sampler 824 and sampler 825 are operatively coupled to calibration control 850. Accordingly, for each of receivers 820, calibration control receives the respective outputs of samplers on each of receivers 820 that correspond to sampler 824 and sampler 825.

In an embodiment, receiver 810 and receivers 820 are configured to receive CALCK as their inputs. Receivers 820 each have their variable delay elements (e.g., variable delay element 823) configured with a predetermined delay input value. For example, each of receivers 820 may have their variable delay elements configured with a delay input value that approximately halfway between the minimum allowed delay input value and the maximum allowed delay input value. For example, if the minimum allowed delay input value is 0 (zero) and the maximum allowed delay input value is 63, then each of receivers 820 may have their variable delay elements configured with a delay input value of 31.

Calibration control 850 varies the delay of delay element 813 to determine (or measure) the relative delay of CALCK's path through receiver 810 to each of receivers 820 versus CALCK's path to the corresponding input of sampler 824 and/or sampler 825 of each of receivers 820. For example, calibration control 850 may sweep DELDQS[0:M−1] through a range of values which results in a sweeping of the delay time from CALCK to the arrival of DSTRB at receivers 820.

Since CALCK is also distributed to, and used as an input to, each of receivers 820, the CALCK to DSTRB path essentially "races" the CALCK to CALSMPL path. Therefore, provided the difference in delays between the CALCK and CALSMPL paths is less than ½ a CALCLK period, if there is more delay along the CALCK to DSTRB path than the CALCK to CALSMPL path for a given receiver 820, sampler 824 of that receiver 820 will register a logical "1" on the rising edge of CALCK and sampler 825 will register a logical "0" on the falling edge of CALCK. However, if there is less delay along the CALCK to DSTRB path than the CALCK to CALSMPL path for a given receiver 820, sampler 824 of that receiver 820 will register a logical "0" on the rising edge of CALCK and sampler 825 will register a logical "1" on the falling edge of CALCK. Accordingly, when calibration control 850 receives the outputs of sampler 824 and sampler 825 for all of receivers 820, calibration control can tell, for a particular setting of DELDQS[0:M−1], whether there is more or less delay along the CALCK to DSTRB path than the CALCK to CALSMPL path for each of the receivers 820.

By varying (e.g., sweeping) DELDQS[0:M−1], calibration control 850 can determine values for DELDQS[ ] that correspond to the transition point between whether there is more delay or less delay along the CALCK to DSTRB path than the CALCK to CALSMPL path. Calibration control 850 can determine these transition point values for each of the receivers 820. These transition point values can be used as a measure of the relative delay along the CALCK to DSTRB path versus the CALCK to CALSMPL path for each of the receivers 820. Using these transition point values, calibration control 850 can set an alignment of DSTRB. In other words, using these transition point values, calibration control 850 can set value for DELDQS[ ] to be used during further operation of strobe distribution system 800. This value for DELDQS[ ] can be used to de-skew each of respective signal ports DQ[ ] for variations caused by mismatches internal to strobe distribution system 800 (i.e., to adjust the variable delays of the delay elements 823 of receivers 820).

In an embodiment (not shown in FIG. 8), rather than include 90° phase shift 814 and 2:1 MUX 816, a 90° phase shift may be introduced into the signal supplied as CALCK at the appropriate times (e.g., when MUX 816 would otherwise be configured to select the output of 90° phase shift 814.) In this case, the output of delay element 813 can be directly coupled to the input of distribution buffer 815, as described previously.

In an embodiment, the minimum transition point value and the maximum transition point value among all of the receivers 820 are used to calculate the DELDQS[ ] to be used during further operation of strobe distribution system 800. A midpoint (or approximate midpoint) of the minimum transition point value and the maximum transition point value can be used during further operation of strobe distribution system 800. By selecting the midpoint of the two extreme transition point values among all of the receivers, the likelihood that one or more of the variable delay elements 823 of the receivers 820 will not have enough range for read eye training or de-skewing is reduced.

Table 1 illustrates pseudocode of an embodiment of the operation of strobe distribution system 800. In Table 1, each of receivers 820 is referred to as a DQ, and a particular receiver 820 is referred to as DQ[#]. For example, a first one of receivers 820 can correspond to DQ[1], a second one of receivers 820 can correspond to DQ[2], etc. The functions Enable90DegDelay( ) and Disable90DegDelay( ) configure MUX 816. The functions Enable90Calclk( ) and DisableCalclk( ) configure MUX 812. The function SetDelay( ) applies the specified value to the DELAY input of delay element 813. The variable samp_out[0:1] corresponds to the outputs of sampler 824 and sampler 825.

TABLE 1

```
For each DQ,
    DQ[#].SetDelay(max_delay/2)
    DQ[#].EnableCalclk( )
DQS.Enable90DegDelay( )
DQS.EnableCalclk( )
DQS.SetDelay(0)
For delay = 0 to max_delay,
    DQS.SetDelay(delay)
    If samp_out[1:0] changes for a given DQ#,
        Edge_Alignment_Delay[#] = delay
Optimal_delay = average({min,max}Edge_Alignment_Delay[ ])
DQS.SetDelay(Optimal_delay)
DQS.DisableCalclk( )
DQS.Disable90DegDelay( )
```

It should be understood that the strobe receiver 810 delay adjustment described in this herein effectively corrects for two error terms: 1) mismatch in DQS path delay due to byte-level strobe distribution (which do not match DQ delays), and 2) statistical variation of the "mid-range" of the delays attributable to receivers 820. Therefore, internal correction of these error terms improves the system timing margin prior to any system timing calibrations. The benefit of this correction is that the physical interface can be made to operate at higher data rates without system-level read eye training.

Figure 9:
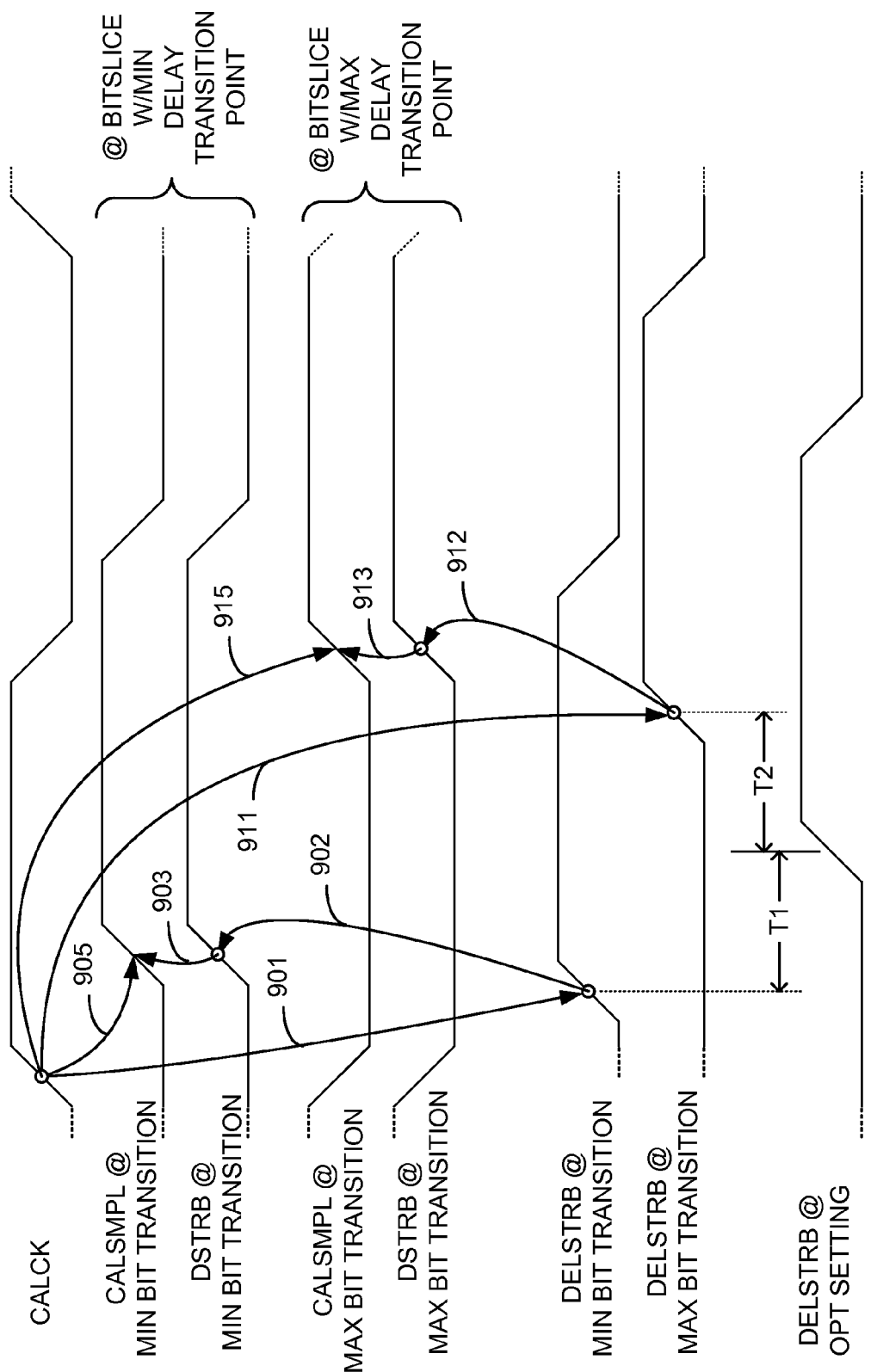
FIG. 9 is a timing diagram illustrating a process of setting a strobe delay element.

FIG. 9 is a timing diagram illustrating a process of setting a strobe delay element. The signals and timings illustrated in FIG. 9 can be understood as examples of signals, timings, and processes of the elements discussed in FIG. 7 and FIG. 8. In FIG. 9, arrow 901 illustrates the relationship (i.e., delay) between CALCK and the output of variable delay element 813 (DELSTRB) when DELDQS[ ] is set to a minimum transition point value. As discussed herein, DELSTRB is distributed to receivers 820 and arrives (after some delay) at the samplers of the one of receivers 820 with the minimum transition point value as DSTRB. This is illustrated by arrow 902. CALCK is also distributed directly to the one of receivers 820 with the minimum transition point value and arrives at the input to the samplers of this receiver 820 via variable delay element 823. These delays are illustrated by arrow 905. As can be understood from arrow 903, at the minimum transition point value, for the corresponding receiver 820, DSTRB and CALSMP arrive at sampler 824 and/or sampler 825 at approximately the same time.

Arrow 911 illustrates the relationship (i.e., delay) between CALCK and the output of variable delay element 813 (DELSTRB) when DELDQS[ ] is set to a maximum transition point value. As discussed herein, DELSTRB is distributed to receivers 820 and arrives (after some delay) at the samplers of the one of receivers 820 with the maximum transition point value. This is illustrated by arrow 912. CALCK is also distributed directly to the one of receivers 820 with the minimum transition point value and arrives at the input to the samplers of this receiver 820 via variable delay element 823. These delays are illustrated by arrow 915. As can be understood from arrow 915, at the maximum transition point value, for the corresponding receiver 820, DSTRB and CALSMP arrive at sampler 824 and/or sampler 825 at approximately the same time.

An approximate midpoint between the timing when DELDQS[ ] is set to a minimum transition point value and when DELDQS[ ] is set to a maximum transition point value is illustrated in FIG. 9. This midpoint timing is shown, for example, in FIG. 9 where T1≈T2. This midpoint timing (whether produced using 90° phase shift 814, or not using 90°phase shift 814, as described previously) allows receivers 820 to sample at approximately the middle of a bit time of their respective DQ[ ]'s. As can be understood from FIG. 9, this midpoint (or approximate midpoint) of the DSTRB timing caused by the minimum transition point value and the DSTRB timing caused by the maximum transition point value places DSTRB where the likelihood that any of the variable delay elements 823 of the receivers 820 will not have enough range for read eye training or de-skewing is reduced.

Figure 10:
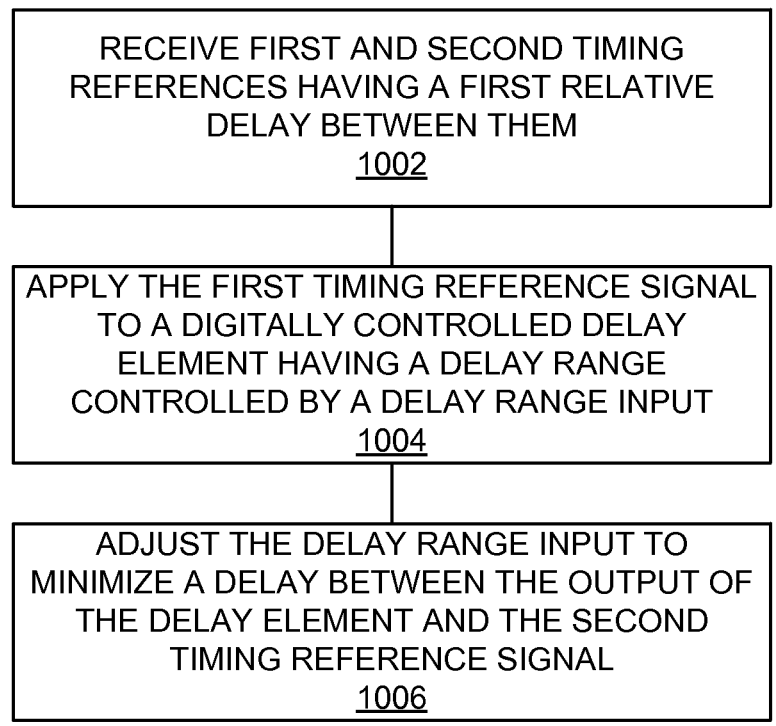
FIG. 10 is a flowchart illustrating a method of setting a delay range.

FIG. 10 is a flowchart illustrating a method of setting a delay range. One or more steps illustrated in FIG. 10 may be performed by one or more elements of variable delay system 100, delay circuit 160, delay element 500, memory system 600, memory system 700, or strobe distribution system 800. First and second timing references that have a first relative delay between them are received (1002). For example, CK1 and CK2 can be received by MUX 120 and calibration control 140 of variable delay system 100, respectively.

The first timing reference is applied to a digitally controlled delay element having a delay range controlled by a delay range input (1004). For example, CK1, as output by MUX 120 can be applied to variable delay element 130. The delay of delay element 130 is controlled by an M bit digital value from calibration control 140. Delay element 130 also has delay range that is controlled a range input (i.e., RANGE).

The delay range input is adjusted to minimize the timing difference between the output of the delay element and the first timing reference signal (1006). For example, calibration control 140 may employ a search algorithm to adjust the RANGE input of delay element 130 to minimize the delay between the output of variable delay element 130 and CK2. Calibration control 140 may employ a search algorithm to adjust the RANGE input of delay element 130 to minimize the delay between the output of variable delay element 130 and CK2 while also varying the delay input between a minimum and maximum value. Varying the delay input between the minimum and maximum value varies the delay provided by delay element 130 over its entire range thereby giving an indication of the range provided by delay element 130 (even though the absolute minimum delay may be different for each RANGE setting).

Figure 11:
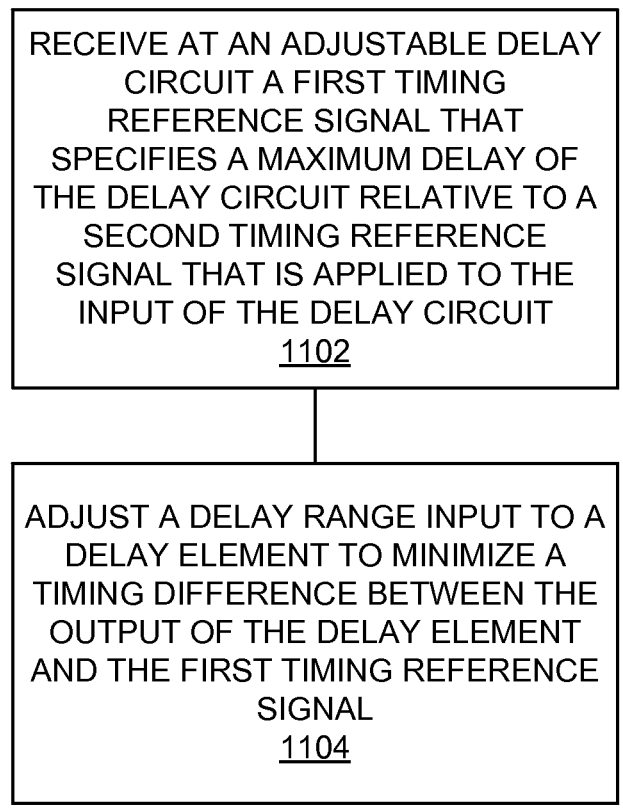
FIG. 11 is a flowchart illustrating a method of setting the delay range of a variable delay element.

FIG. 11 is a flowchart illustrating a method of setting the delay range of a variable delay element. One or more steps illustrated in FIG. 11 may be performed by one or more elements of variable delay system 100, delay circuit 160, delay element 500, memory system 600, memory system 700, or strobe distribution system 800. At an adjustable delay circuit, a first timing reference signal that specifies a maximum delay of the delay circuit relative to a second timing reference signal that is applied to the input of the delay circuit is received (1102). For example, delay circuit 160 may receive CK2 and CK1. The phase delay between CK2 and CK1 may specify the maximum delay that delay element 130 is to provide. The maximum delay that is specified by the delay between CK2 and CK1 may be a minimum delay through delay element 130 plus a range of delays to be provided by delay circuit 130 that result in a desired maximum delay that delay element 130 is to provide. In an embodiment, a minimum delay through delay element 130 may be estimated, ignored, or obtained from circuit simulation.

A delay range input to a delay element is adjusted to minimize a timing difference between the output of the delay element and the first timing reference signal (1104). For example, calibration control 140 can iteratively adjust the RANGE setting of delay element 130 in order to minimize the timing difference between the output of delay element 130, DEL_OUT, and CK2. Calibration control 140 can use a linear search for the desired RANGE input. Calibration control 140 may use other search algorithms (e.g., binary search) to find the RANGE input value that corresponds to minimized timing difference between DEL_OUT and CK2.

Figure 12:
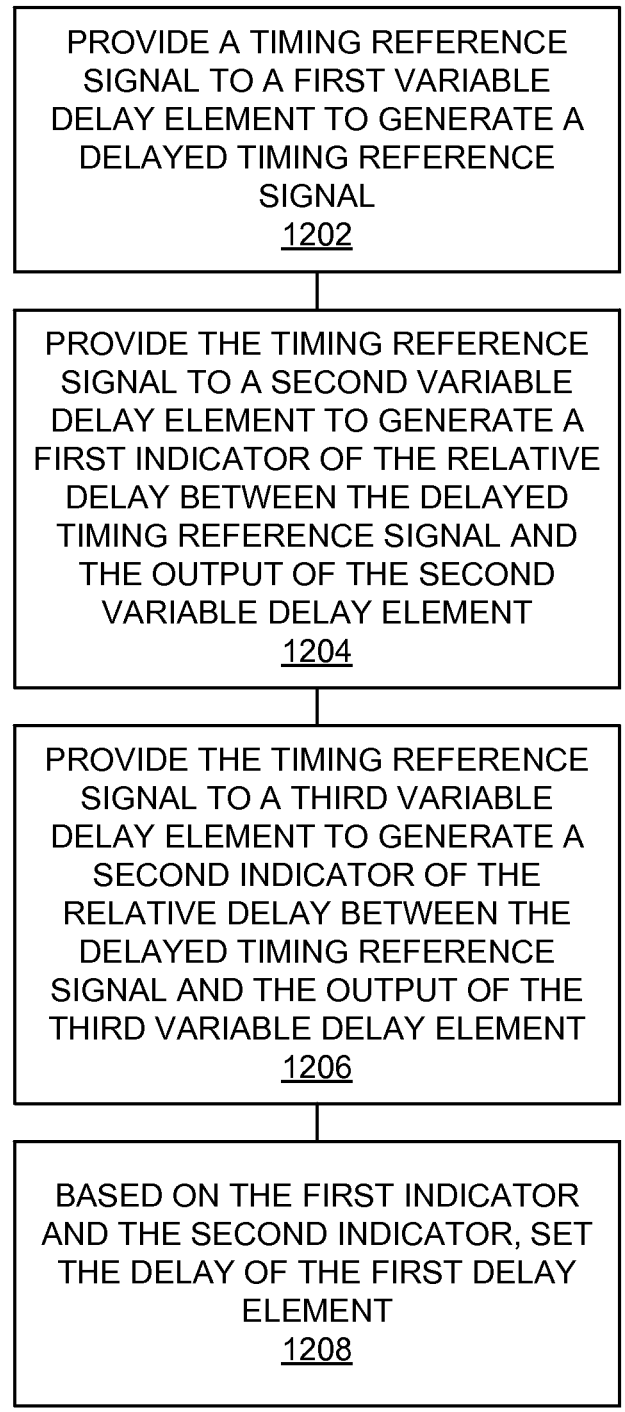
FIG. 12 is a flowchart illustrating a method of setting a delay that is applied to a timing reference.

FIG. 12 is a flowchart illustrating a method of setting a delay applied to a timing reference. One or more steps illustrated in FIG. 12 may be performed by one or more elements of variable delay system 100, delay circuit 160, delay element 500, memory system 600, memory system 700, or strobe distribution system 800. A timing reference signal is provided to a first variable delay element to generate a delayed timing reference signal (1202). For example, CALCK may be provided to delay element 813 by configuring MUX 812 of strobe receiver 810 accordingly. Strobe receiver 810 can distribute the output of delay element 813 to receivers 820.

The timing reference is provided to a second variable delay element to generate a first indicator of the relative delay between the delay timing reference signal and the output of the second variable delay element (1204). For example, CALCK may be provided to delay element 823 of a first one of the receivers 820 by configuring MUX 822 of that first receiver accordingly. One or more of sampler 824 and sampler 825 of that first receiver can generate a first indicator of the relative delay between the distributed output of delay element 813 and the output of the delay element 823 of the first one of the receivers 820. This first indicator may indicate which of the distributed output of delay element 813 as it arrives at the first receiver or the output of the delay element 823 of the first one of the receivers 820 results in more (or less) delay to the common input timing reference, CALCK. This first one of the receivers 820 may result in the minimum delay to the common input timing reference, CALCK, among all of receivers 820.

The timing reference is provided to a third variable delay element to generate a second indicator of the relative delay between the delay timing reference signal and the output of the third variable delay element (1206). For example, CALCK may be provided to delay element 823 of a second one of the receivers 820 by configuring MUX 822 of that second receiver accordingly. One or more of sampler 824 and sampler 825 of that second receiver can generate a second indicator of the relative delay between the distributed output of delay element 813 and the output of the delay element 823 of the second one of the receivers 820. This second indicator may indicate which of the distributed output of delay element 813 as it arrives at the second receiver or the output of the delay element 823 of the second one of the receivers 820 results in more (or less) delay to the common input timing reference, CALCK. This second one of the receivers 820 may result in the maximum delay to the common input timing reference, CALCK, among all of receivers 820.

Based on the first indicator and the second indicator, the delay of the first delay element is set (1208). For example, based on the first indicator and the second indicator, calibration control 850 may select a value for the DELAY input of delay element 813. If the first indicator corresponds to a minimum delay, and the second indicator corresponds to a maximum delay, calibration control may, for example, select a value for the DELAY input of delay element 813 that causes delay element 813 to produce a delay that is an approximate midpoint between the minimum delay and the maximum delay.

Figure 13:
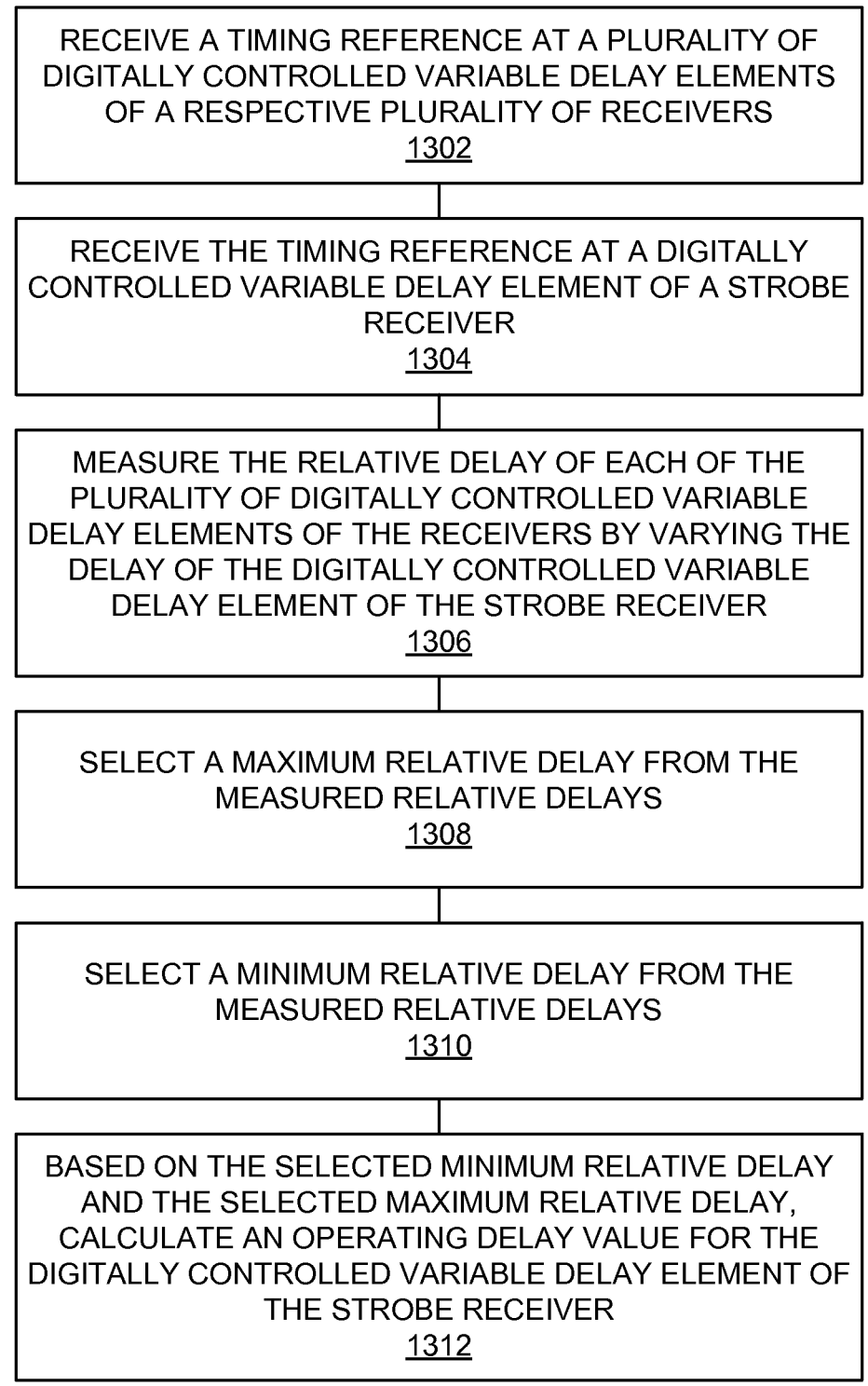
FIG. 13 is a flowchart illustrating a method of setting a strobe delay.

FIG. 13 is a flowchart illustrating a method of setting a strobe delay. One or more steps illustrated in FIG. 13 may be performed by one or more elements of variable delay system 100, delay circuit 160, delay element 500, memory system 600, memory system 700, or strobe distribution system 800. A timing reference is received at a plurality of digitally controlled variable delay element of a respective plurality of receivers (1302). For example, timing reference signal CALCK may be received at each of the delay elements 823 of receivers 820. The timing reference is received at a digitally controlled variable delay element of a strobe receiver (1304). For example, timing reference signal CALCK may be received at delay element 813 of strobe receiver 810.

The relative delay of each of the plurality of digitally controlled variable delay elements of the receivers is measured by varying the delay of the digitally controlled variable delay element of the strobe receiver (1306). For example, calibration control 850 may vary the value of the DELAY input to delay element 813. This varies the delay of delay element 813. At one or more of these varied delays, one or more of sampler 824 and/or sampler 825 of each of receivers 820 reports to calibration control 850 which of CALSMPL or CALSTRB (i.e., delayed versions of CALCK) arrived with more (or less) delay. By changing the delay that CALSTRB arrives (i.e., by varying the delay of delay element 813), calibration control can measure the relative delay from CALCK, through a respective delay element 823, to the input of a respective sampler 824 and/or 825 of a respective receiver 820. These relative delays may correspond to the DELAY input setting that is at (or near) a transition point between which of CALSMPL or CALSTRB arrived with more (or less) delay.

A maximum relative delay from the measured relative delays is selected (1308). For example, calibration control 850 may select the maximum DELAY input setting that, among all of receivers 820, corresponds to a transition point between which of CALSMPL or CALSTRB arrived with more delay.

A minimum relative delay from the measured relative delays is selected (1310). For example, calibration control 850 may select the minimum DELAY input setting that, among all of receivers 820, corresponds to a transition point between which of CALSMPL or CALSTRB arrived with more delay.

Based on the selected minimum relative delay and the selected maximum relative delay, calculate an operating delay value for the digitally controlled variable delay element of the strobe receiver (1312). For example calibration control 850 may calculate a midpoint between the maximum DELAY input setting selected in box 1308 and the minimum DELAY input setting selected in box 1310. This midpoint (or approximate midpoint, or rounded to a nearby integer midpoint) may be applied by calibration control to the DELAY input of delay element 813 of strobe receiver 810 during further operation (e.g., non-calibration mode operation).

The systems and devices described above may be implemented in computer systems, integrated circuits, or stored by computer systems. The methods described above may be stored on a non-transitory computer readable medium. Devices, circuits, and systems described herein may be implemented using computer-aided design tools available in the art, and embodied by non-transitory computer-readable files containing software descriptions of such circuits. This includes, but is not limited to, one or more elements of variable delay system 100, delay circuit 160, delay element 500, memory system 700, memory system 900, or strobe distribution system 800, and their components. These software descriptions may be: behavioral, register transfer, logic component, transistor, and layout geometry-level descriptions.

Moreover, the software descriptions may be stored on non-transitory storage media or communicated by carrier waves.

Data formats in which such descriptions may be implemented include, but are not limited to: formats supporting behavioral languages like C, formats supporting register transfer level (RTL) languages like Verilog and VHDL, formats supporting geometry description languages (such as GDSII, GDSIII, GDSIV, CIF, and MEBES), and other suitable formats and languages. Moreover, data transfers of such files on machine-readable media may be done electronically over the diverse media on the Internet or, for example, via email. Note that physical files may be implemented on machine-readable media such as: 4 mm magnetic tape, 8 mm magnetic tape, 3½ inch floppy media, CDs, DVDs, Blu-Ray, and so on.

Figure 14:
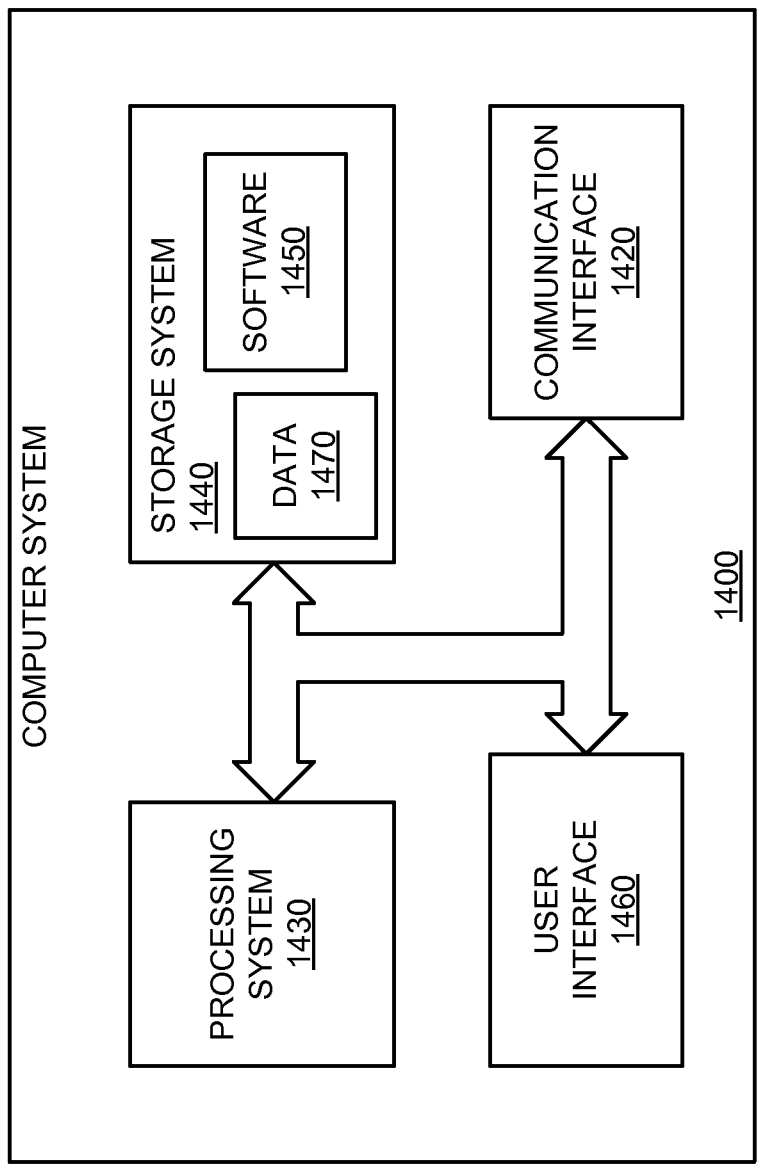
FIG. 14 is a block diagram of a computer system.

FIG. 14 illustrates a block diagram of a computer system. Computer system 1400 includes communication interface 1420, processing system 1430, storage system 1440, and user interface 1460. Processing system 1430 is operatively coupled to storage system 1440. Storage system 1440 stores software 1450 and data 1470. Computer system 1400 may include one or more of variable delay system 100, delay circuit 160, delay element 500, memory system 700, memory system 900, or strobe distribution system 800, or components that implement the methods, circuits, and/or waveforms described herein.

Processing system 1430 is operatively coupled to communication interface 1420 and user interface 1460. Computer system 1400 may comprise a programmed general-purpose computer. Computer system 1400 may include a microprocessor. Computer system 1400 may comprise programmable or special purpose circuitry. Computer system 1400 may be distributed among multiple devices, processors, storage, and/or interfaces that together comprise elements 1420-1470.

Communication interface 1420 may comprise a network interface, modem, port, bus, link, transceiver, or other communication device. Communication interface 1420 may be distributed among multiple communication devices. Processing system 1430 may comprise a microprocessor, microcontroller, logic circuit, or other processing device. Processing system 1430 may be distributed among multiple processing devices. User interface 1460 may comprise a keyboard, mouse, voice recognition interface, microphone and speakers, graphical display, touch screen, or other type of user interface device. User interface 1460 may be distributed among multiple interface devices. Storage system 1440 may comprise a disk, tape, integrated circuit, RAM, ROM, EEPROM, flash memory, network storage, server, or other memory function. Storage system 1440 may include computer readable medium. Storage system 1440 may be distributed among multiple memory devices.

Processing system 1430 retrieves and executes software 1450 from storage system 1440. Processing system 1430 may retrieve and store data 1470. Processing system 1430 may also retrieve and store data via communication interface 1420. Processing system 1430 may create or modify software 1450 or data 1470 to achieve a tangible result. Processing system 1430 may control communication interface 1420 or user interface 1460 to achieve a tangible result. Processing system 1430 may retrieve and execute remotely stored software via communication interface 1420.

Software 1450 and remotely stored software may comprise an operating system, utilities, drivers, networking software, and other software typically executed by a computer system. Software 1450 may comprise an application program, applet, firmware, or other form of machine-readable processing instructions typically executed by a computer system. When executed by processing system 1430, software 1450 or remotely stored software may direct computer system 1400 to operate.

The foregoing description of the invention has been presented for purposes of illustration and description. It is not intended to be exhaustive or to limit the invention to the precise form disclosed, and other modifications and variations may be possible in light of the above teachings. The embodiment was chosen and described in order to best explain the principles of the invention and its practical application to thereby enable others skilled in the art to best utilize the invention in various embodiments and various modifications as are suited to the particular use contemplated. It is intended that the appended claims be construed to include other alternative embodiments of the invention except insofar as limited by the prior art.

What is claimed is:

1. A controllable delay element, comprising:
    a delay element to provide a variable delay to an input signal to generate an output signal, the variable delay to be controlled by a digital delay input, the delay element to have a delay range of the variable delay between a first delay to be set by a first value of the digital delay input and a second delay to be set by a second value of the digital delay input, the first delay and the second delay to be referenced to a same edge of the output signal; and,
    a delay range control circuit to control the delay range in response to a delay range input.

2. The controllable delay element of claim 1, further comprising:
    a delay range calibration circuit to set the delay range input in response to a relative delay between a first timing reference and a second timing reference.

3. The controllable delay element of claim 2, wherein the delay range calibration circuit is to set the delay range input to minimize a difference between the second delay and the relative delay between the first timing reference and the second timing reference.

4. The controllable delay element of claim 2, wherein the first timing reference is to be received as the input signal and a delay between a received first timing reference and the second timing reference signal is to be adjusted to minimize a first timing difference between the output signal and the received first timing reference signal.

5. The controllable delay element of claim 4, wherein the delay range calibration circuit is to adjust the delay range input to minimize a second timing difference between the output signal and the received first timing reference signal while the second value is received by the digital delay input.

6. The controllable delay element of claim 5, wherein the delay between the received first timing reference and the second timing reference signal is to be adjusted to minimize the first delay between the output signal and the received first timing reference signal while the first value is received by the digital delay input.

7. The controllable delay element of claim 6, wherein the first value corresponds to the delay element providing a minimum delay and the second value corresponds to the delay element providing a maximum delay.

8. A method of calibrating a delay element, comprising:
    receiving a first timing reference and a second timing reference while the first timing reference and the second timing reference have a first relative delay between the first timing reference and the second timing reference;
    applying the first timing reference to a signal input of a digitally controlled delay element, the digitally controlled delay element providing a variable delay to the first timing reference to generate an output signal, the variable delay controlled by a digital delay input, the delay element having an adjustable delay range of the variable delay between a first delay set by a first value of the digital delay input and a second delay set by a second value of the digital delay input, the delay range set by a delay range input; and,
    adjusting the delay range input to minimize a delay between the output signal and the second timing reference.

9. The method of claim 8, further comprising:
    receiving the first timing reference and the second timing reference while the first timing reference and the second timing reference have a second relative delay between the first timing reference and the second timing reference; and,
    adjusting, from the second relative delay, a relative timing of the first timing reference and the second timing reference to minimize a timing difference between the output signal and the second timing reference.

10. The method of claim 9, wherein the delay range input is set to produce a minimum adjustable delay range while the relative timing of the first timing reference and the second timing reference are adjusted to minimize a timing difference between the output signal and the second timing reference.

11. The method of claim 9, wherein the first value corresponds to the delay element providing a minimum delay and the second value corresponds to the delay element providing a maximum delay.

12. The method of claim 11, wherein the delay range input is adjusted to minimize a timing difference between the output signal and the second timing reference while the digital delay input is set at the second value.

13. The method of claim 9, further comprising:
    receiving a third timing reference at a plurality of digitally controlled variable delay elements of a respective plurality of receivers, a respective delay of each of the plurality of digitally controlled variable delay elements each controlled by a respective first digital input value;
    receiving the third timing reference at a digitally controlled variable delay element of a strobe receiver, a delay of the digitally controlled variable delay element of the strobe receiver controlled by a second digital input value; and,
    measuring a relative delay of each of the respective delay of each of the plurality of digitally controlled variable delay elements while each of the respective first digital input values are set at a predetermined value, the relative delay of each of the respective delay of each of the plurality of digitally controlled variable delay elements measured by varying the second digital input value and detecting a state of a respective sampler of each of the respective plurality of receivers for a plurality of digital input values.

14. An interface, comprising:
    a strobe receiver including a first delay element to provide a first variable delay to an input timing reference signal to generate an output timing reference signal, the first variable delay to be controlled by a first delay input value; and,
    a plurality of input receivers each including second delay elements to provide a plurality of second variable delays to the input timing reference signal to generate a respective output that is provided as an input to a respective sampler that is to be clocked by the output timing reference signal, the respective second variable delays to be controlled by respective second delay input values, the outputs of the respective samplers providing indicators of a respective relative timing of the respective second variable delays.

15. The interface of claim 14, wherein the indicators of respective relative timing of the respective second variable delays are used to determine a first delay input value.

16. The interface of claim 14, wherein a plurality of first delay input values are used to measure a plurality of respective relative timings of the second variable delays each associated with an input receiver of the plurality of input receivers.

17. The interface of claim 16, wherein the plurality of first delay input values are used to measure the plurality of respective relative timings of the second variable delays while the respective second delay input values are each set to a predetermined value.

18. The interface of claim 17, wherein the predetermined value is associated with a midpoint delay that can be provided by the second delay elements.

19. The interface of claim 14, wherein a plurality of first delay input values are used to measure a plurality of respective relative timings of the second variable delays each associated with an input receiver of the plurality of input receivers, the plurality of respective relative timings including a maximum measured timing and a minimum measure timing.

20. The interface of claim 19, wherein the first delay input value is set based on the maximum measured timing and the minimum measure timing.

* * * * *